US012046660B2

(12) United States Patent
Lin et al.

(10) Patent No.: US 12,046,660 B2
(45) Date of Patent: Jul. 23, 2024

(54) NON-CONFORMAL CAPPING LAYER AND METHOD FORMING SAME

(71) Applicant: Taiwan Semiconductor Manufacturing Co., Ltd., Hsinchu (TW)

(72) Inventors: Ming-Ho Lin, Taipei (TW); Cheng-I Lin, Hsinchu (TW); Chun-Heng Chen, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 69 days.

(21) Appl. No.: 17/813,793

(22) Filed: Jul. 20, 2022

(65) Prior Publication Data

US 2022/0359720 A1    Nov. 10, 2022

Related U.S. Application Data

(63) Continuation of application No. 16/880,464, filed on May 21, 2020, now Pat. No. 11,437,491.

(60) Provisional application No. 62/928,771, filed on Oct. 31, 2019.

(51) Int. Cl.
| H01L 29/66 | (2006.01) |
| H01L 21/02 | (2006.01) |
| H01L 29/06 | (2006.01) |
| H01L 29/78 | (2006.01) |
| H01L 21/3213 | (2006.01) |

(52) U.S. Cl.
CPC .. *H01L 29/66545* (2013.01); *H01L 21/02274* (2013.01); *H01L 21/0228* (2013.01); *H01L 29/0653* (2013.01); *H01L 29/66795* (2013.01); *H01L 29/785* (2013.01); *H01L 21/32134* (2013.01); *H01L 21/32135* (2013.01)

(58) Field of Classification Search
None
See application file for complete search history.

(56) References Cited

U.S. PATENT DOCUMENTS

| 7,745,871 | B2 | 6/2010 | Oh et al. |
| 7,863,122 | B2 | 1/2011 | Booth, Jr. et al. |
| 7,968,442 | B2 | 6/2011 | Kang et al. |
| 9,564,435 | B2 | 2/2017 | Chung et al. |
| 10,510,851 | B2 | 12/2019 | Wang et al. |
| 10,833,196 | B2 | 11/2020 | Wang et al. |
| 2008/0001187 | A1 | 1/2008 | Booth et al. |
| 2008/0233699 | A1 | 9/2008 | Booth et al. |
| 2015/0270398 | A1 | 9/2015 | Jacob et al. |

(Continued)

FOREIGN PATENT DOCUMENTS

| JP | 2008010876 A | 1/2008 |
| KR | 20050116073 A | 12/2005 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method includes forming a protruding structure, and forming a non-conformal film on the protruding structure using an Atomic Layer Deposition (ALD) process. The non-conformal film includes a top portion directly over the protruding structure, and a sidewall portion on a sidewall of the protruding structure. The top portion has a first thickness, and the sidewall portion has a second thickness smaller than the first thickness.

20 Claims, 28 Drawing Sheets

(56) References Cited

U.S. PATENT DOCUMENTS

| 2017/0358576 | A1 | 12/2017 | Anderson et al. |
| 2018/0151704 | A1 | 5/2018 | Chen et al. |
| 2018/0182618 | A1 | 6/2018 | Blanquart et al. |

FOREIGN PATENT DOCUMENTS

| KR | 20100048690 | A | 5/2010 |
| KR | 20140143841 | A | 12/2014 |
| KR | 20160043455 | A | 4/2016 |
| KR | 20180069704 | A | 6/2018 |
| TW | 201830700 | A | 8/2018 |
| TW | I673873 | B | 10/2019 |
| WO | 2013154842 | A1 | 10/2013 |

NON-CONFORMAL CAPPING LAYER AND METHOD FORMING SAME

PRIORITY CLAIM AND CROSS-REFERENCE

This application is a continuation of U.S. application Ser. No. 16/880,464, entitled "Non-Conformal Capping Layer and Method Forming Same," and filed May 21, 2020, which claims the benefit of the U.S. Provisional Application No. 62/928,771, filed Oct. 31, 2019, and entitled "Non-Conformal Capping Layer and Method Forming Same," which applications are hereby incorporated herein by reference.

BACKGROUND

Transistors are basic building elements in integrated circuits. In previous development of the integrated circuits, Fin Field-Effect Transistors (FinFETs) have been formed to replace planar transistors. In the formation of FinFETs, semiconductor fins are formed, and dummy gates are formed on the semiconductor fins. The formation of the dummy gates may include depositing a dummy layer such as a polysilicon layer, and then patterning the dummy layer as dummy gates. Gate spacers are formed on the sidewalls of the dummy gate stacks. The dummy gate stacks are then removed to form trenches between the gate spacers. Replacement gates are then formed in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
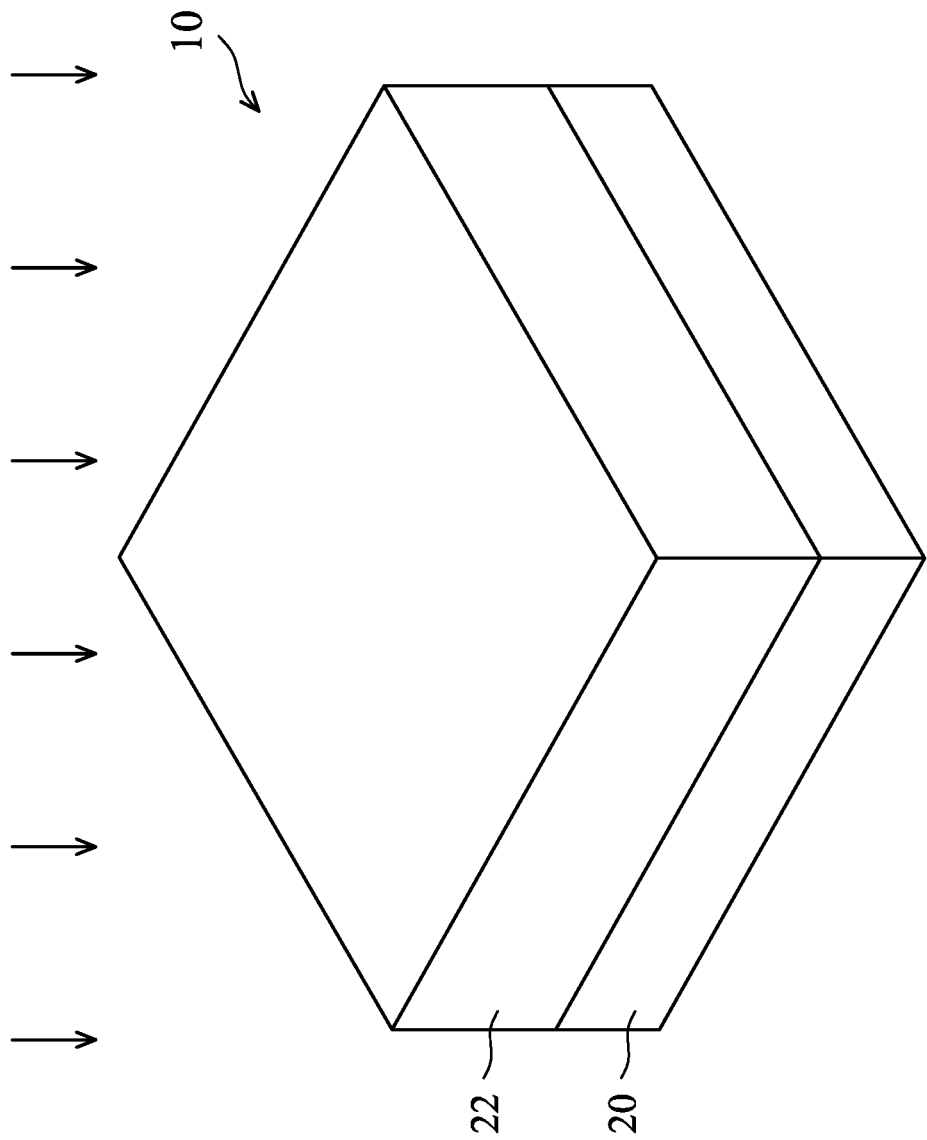
FIGS. 1-3, 4A, 4B, 5A, 5B, 5C, 5D, 6A, 6B, 7A, 7B, 8-10, 11A, 11B, 12A, 12B, 13, 14A, 14B, and 15 illustrate perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A non-conformal capping layer and the method of forming the same are provided in accordance with some embodiments. The intermediate stages in the formation of the non-conformal capping layer and using it in the formation of a Fin Field-Effect Transistor (FinFET) are illustrated in accordance with some embodiments. Some variations of some embodiments are discussed. The embodiments may also be applied on other embodiments in which non-conformal layers are to be formed, which may be, or may not be, in FinFET processes. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements.

Although method embodiments may be discussed as being performed in a particular order, other method embodiments may be performed in any logical order.

FIGS. 1-3, 4A, 4B, 5A, 5B, 5C, 5D, 6A, 6B, 7A, 7B, 8-10, 11A, 11B, 12A, 12B, 13, 14A, 14B, and 15 illustrate the cross-sectional views and perspective views of intermediate stages in the formation of a FinFET in accordance with some embodiments of the present disclosure. The corresponding processes are also reflected schematically in the process flow shown in FIG. 19.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 19:
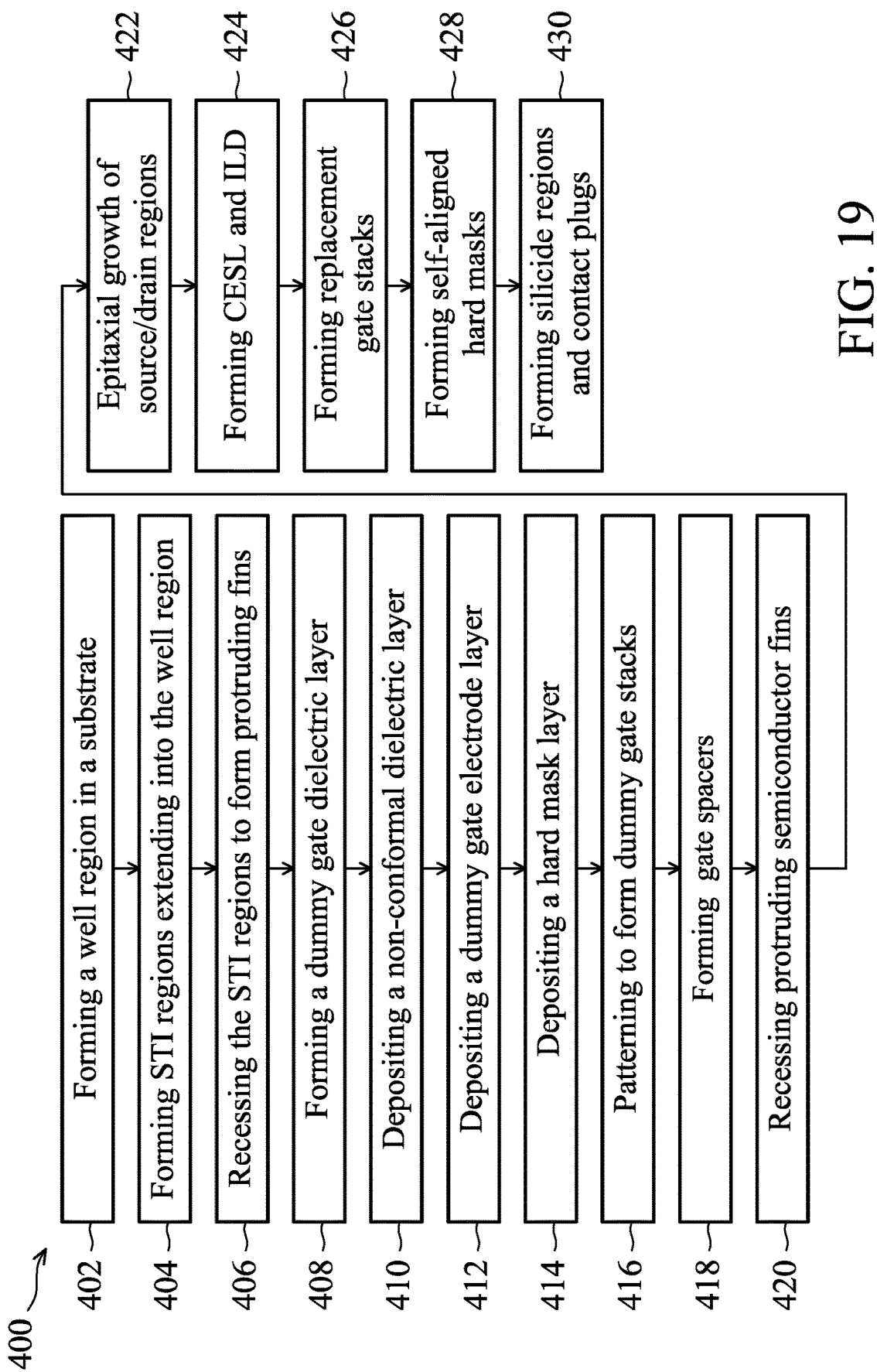
FIG. 19 illustrates a process flow for forming a FinFET in accordance with some embodiments.

Further referring to FIG. 1, well region 22 is formed in substrate 20. The respective process is illustrated as process 402 in the process flow 400 as shown in FIG. 19. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
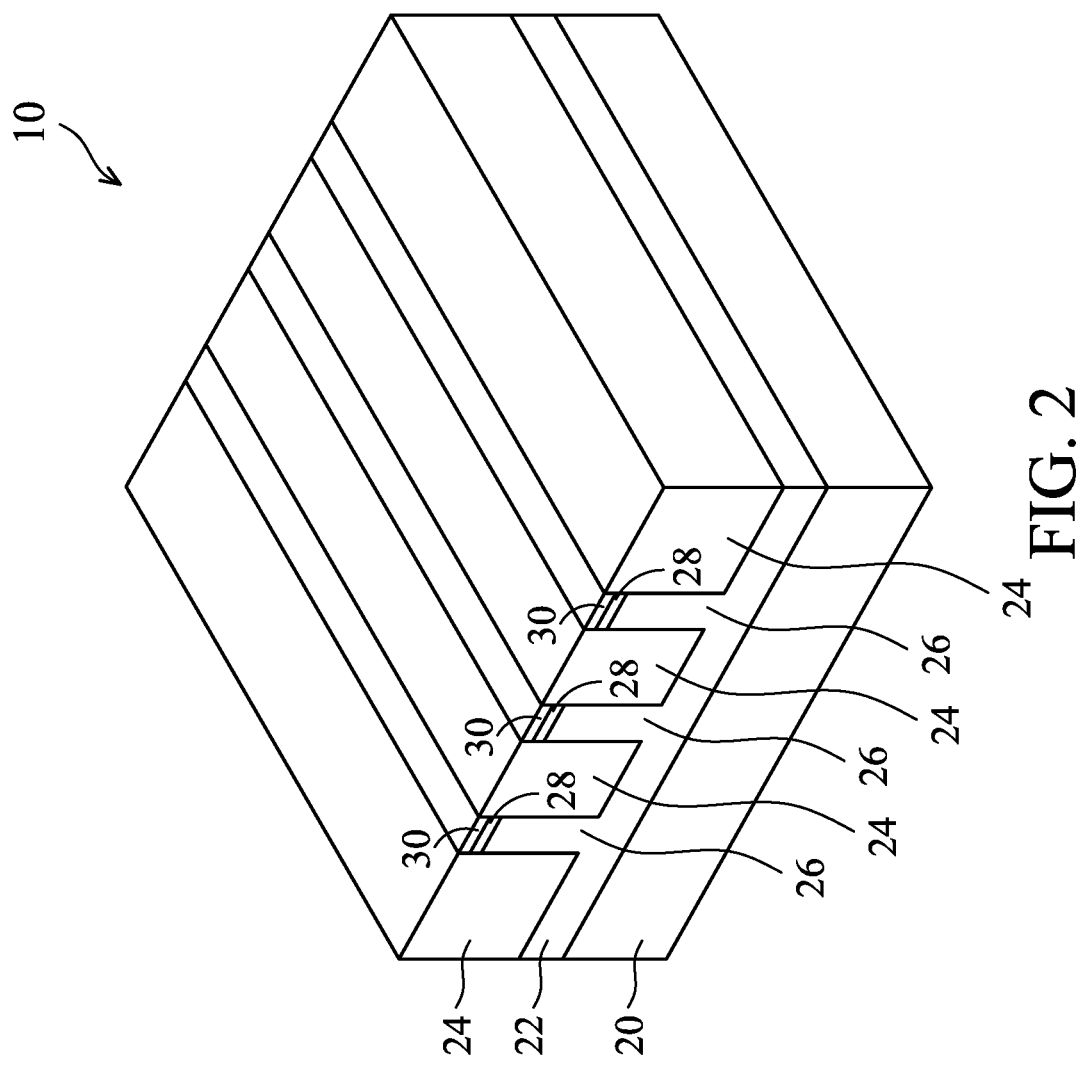

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 as shown in FIG. 19. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
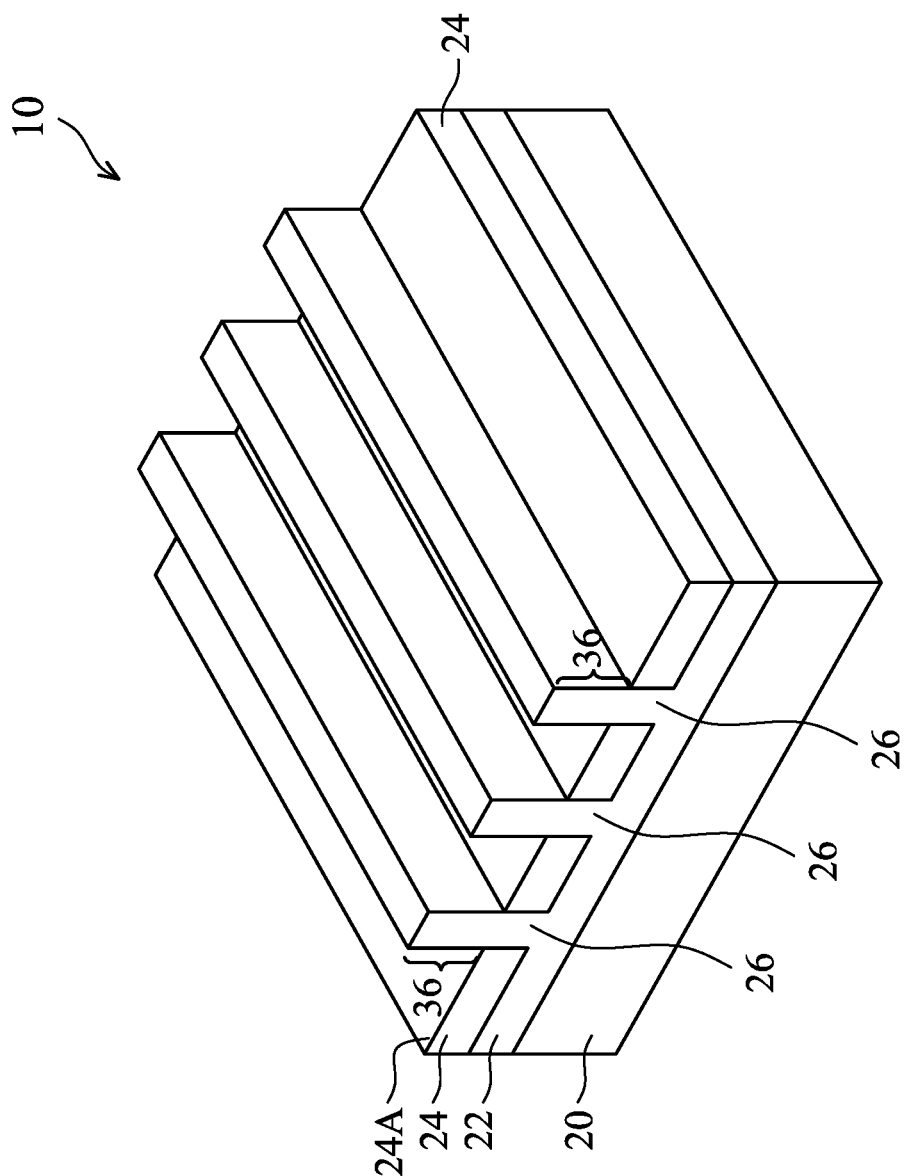

Referring to FIG. 3, STI regions 24 are recessed. The top portions of semiconductor strips 26 thus protrude higher than the top surfaces 24A of the remaining portions of STI regions 24 to form protruding fins 36. The respective process is illustrated as process 406 in the process flow 400 as shown in FIG. 19. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4A:
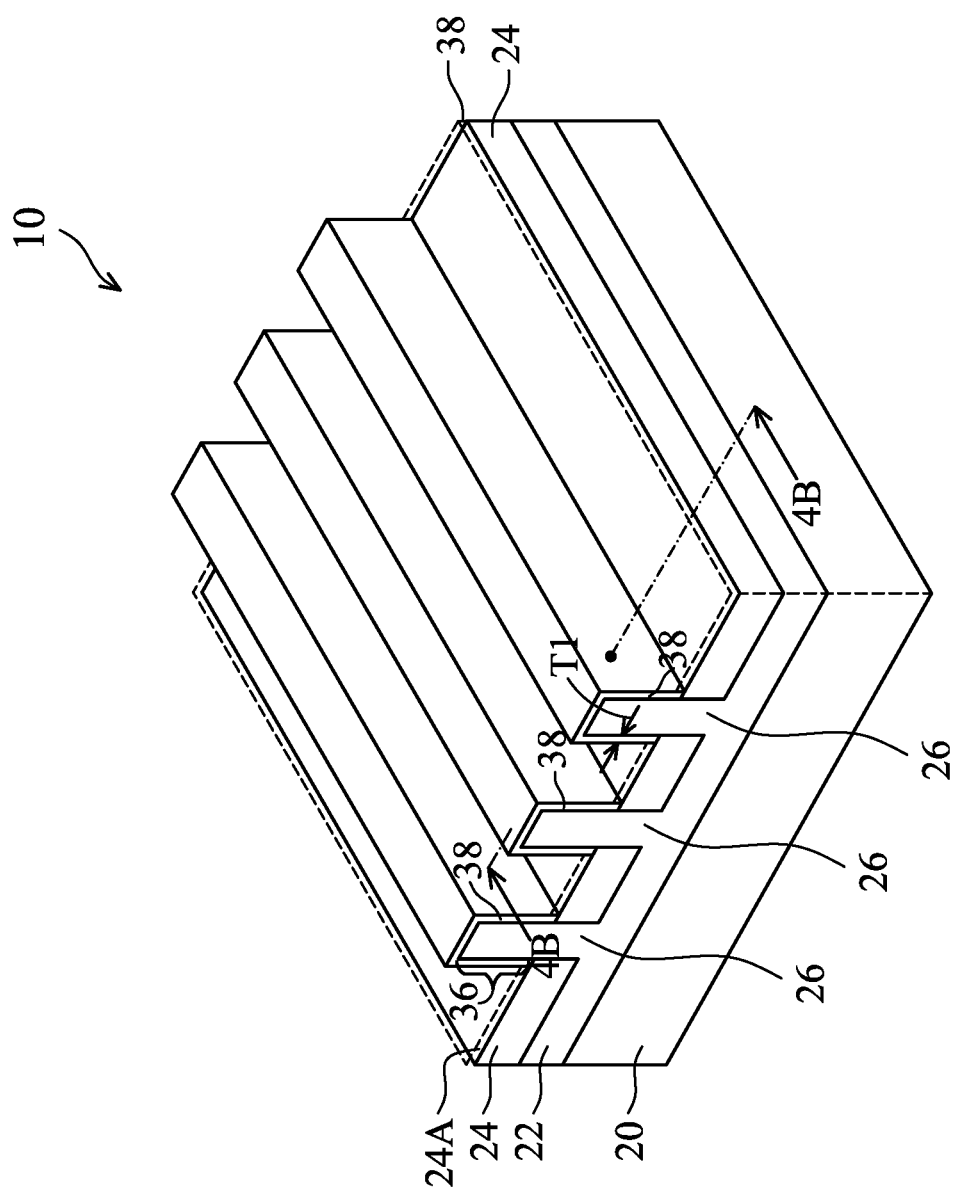
Figure 4B:
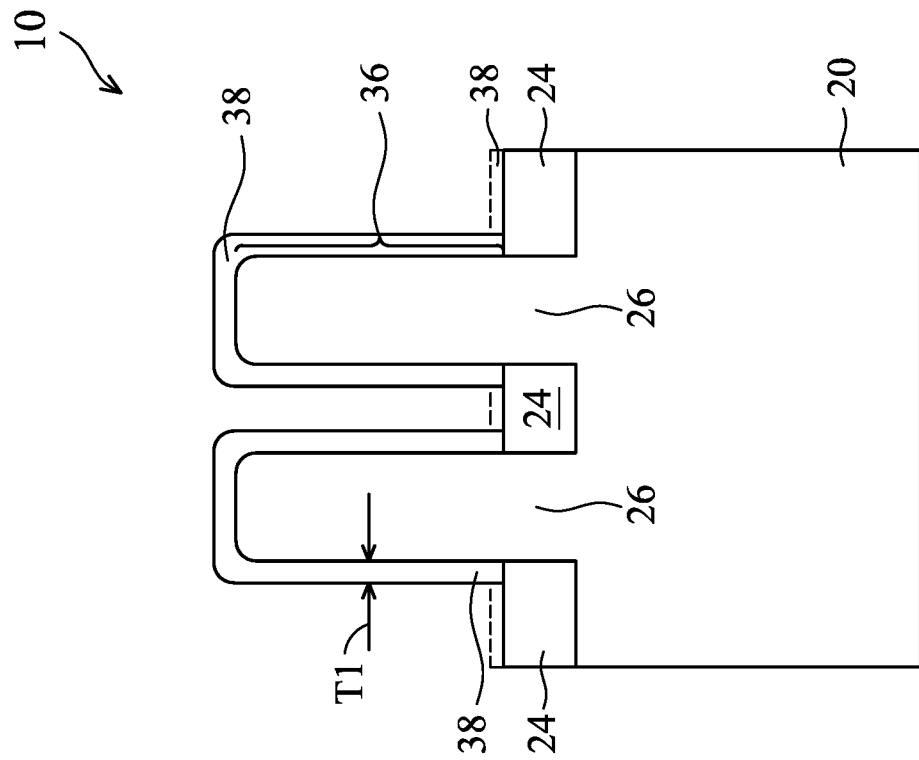

FIGS. 4A, 4B, 5A, 5B, 5C, 5D, 6A, 6B, 7A, and 7B illustrate the formation of dummy gate stacks 45 in accordance with some embodiments. Referring to FIG. 4A, dummy dielectric layer 38 is formed. The respective process is illustrated as process 408 in the process flow 400 as shown in FIG. 19. In accordance with some embodiments of the present disclosure, dummy dielectric layer 38 is formed using a conformal deposition process, which may include Atomic Layer Deposition (ALD), Chemical Vapor Deposition (CVD), or the like. The material of dielectric layer 38 may include silicon oxide, silicon nitride, silicon carbonitride, or the like. With the conformal deposition process being used, the horizontal thickness of the horizontal portions and the vertical thickness of the vertical portions of dielectric layer 38 are equal to each other or substantially equal to each other, for example, with a difference smaller than about 20 percent of the horizontal thickness. In accordance with some embodiments, the thickness T1 of dielectric layer 38 is in the range between about 1 nm and about 10 nm. In accordance with alternative embodiments, dielectric layer 38 is formed by oxidizing (for example, using a thermal oxidation process) the surface portions of protruding fins 36. The resulting dielectric layer 38 will be formed on the exposed surfaces of protruding fins 36, but not on the top surfaces of STI regions 24. Accordingly, dashed lines are used to show that some portions of dielectric layer 38 on the top of STI regions 24 may or may not be formed, depending on the formation process. FIG. 4B illustrates the reference cross-section 4B-4B as shown in FIG. 4A.

Figure 5A:
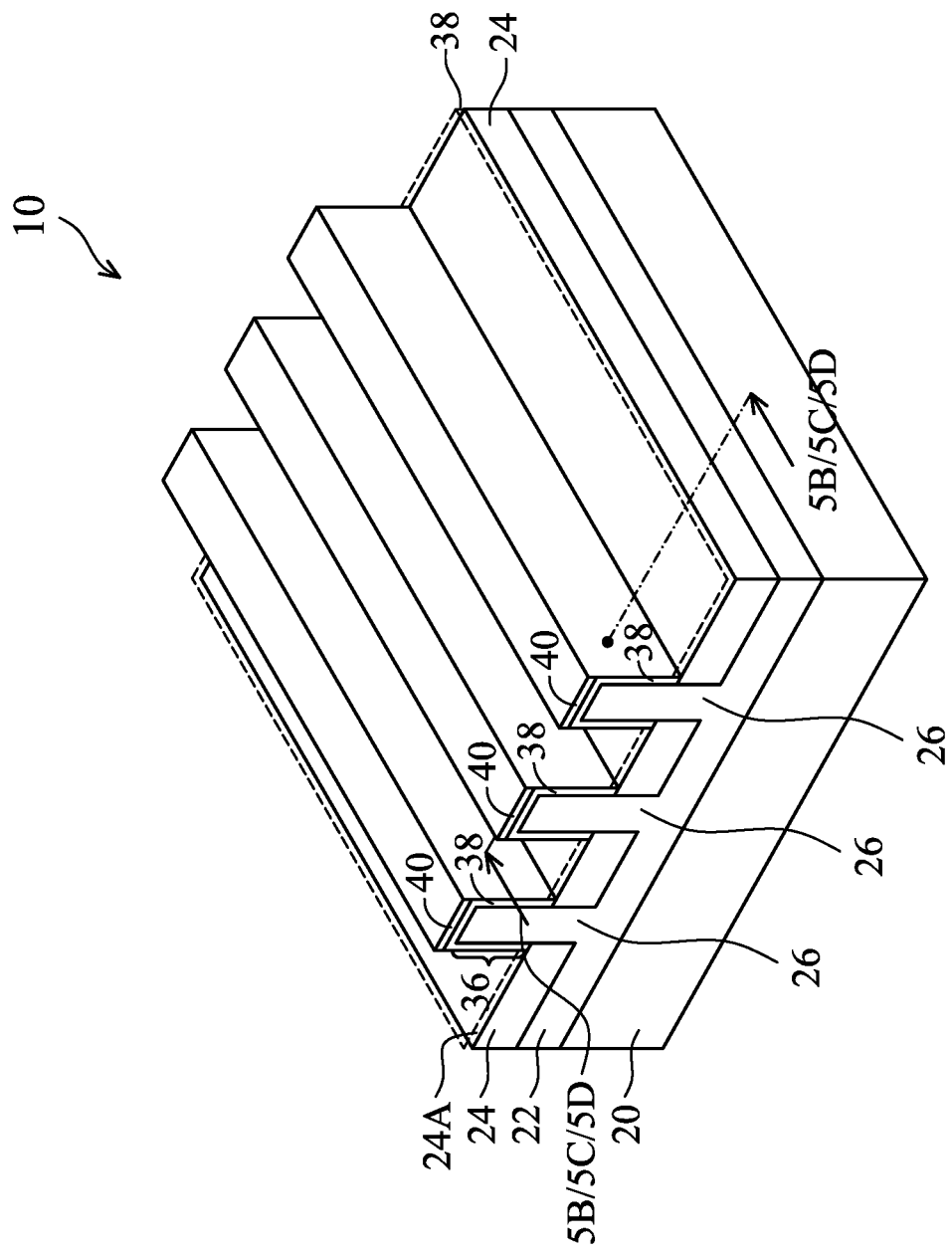

FIG. 5A illustrates the formation of non-conformal capping layer 40 in accordance with some embodiments of the present disclosure. The respective process is illustrated as process 410 in the process flow 400 as shown in FIG. 19. As shown in FIG. 5A, non-conformal capping layer 40 is formed on dielectric layer 38, and does not include horizontal portions directly over STI regions 24.

Figure 5B:
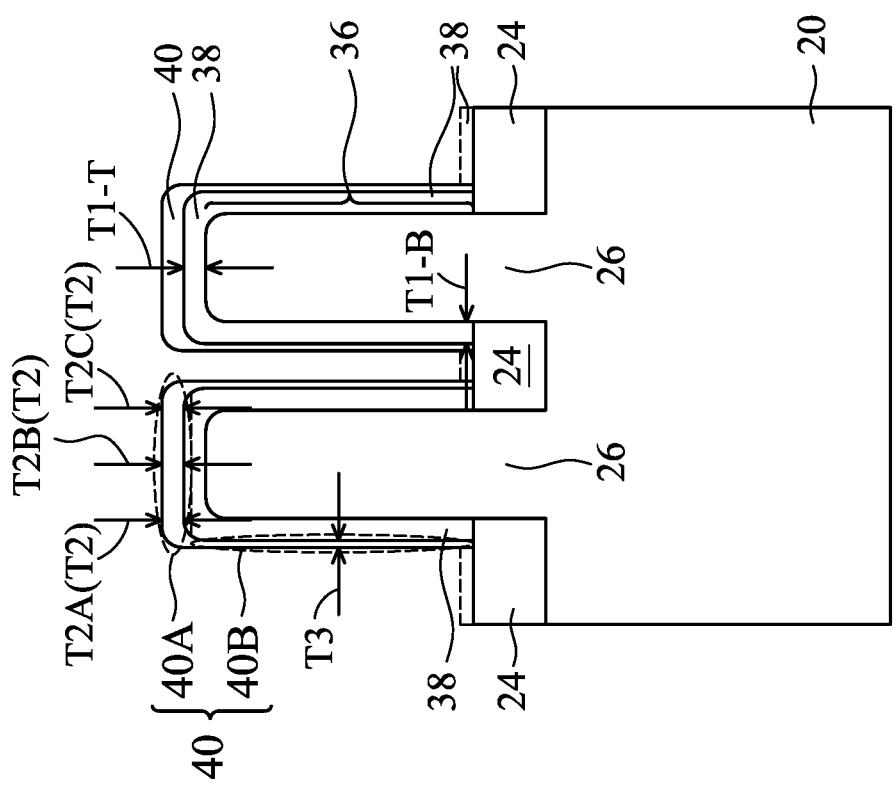
Figure 5C:
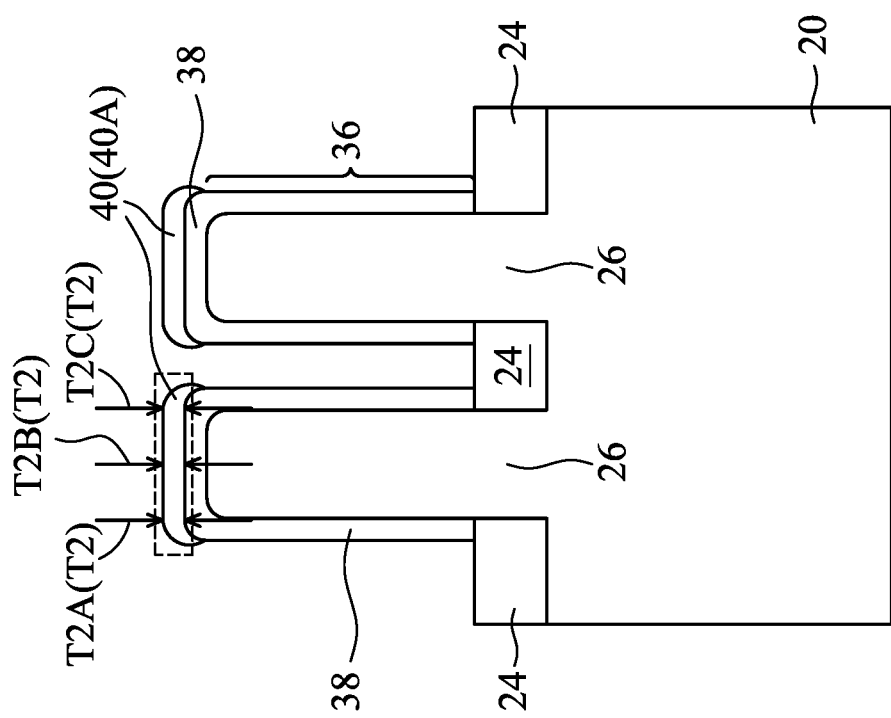
Figure 5D:
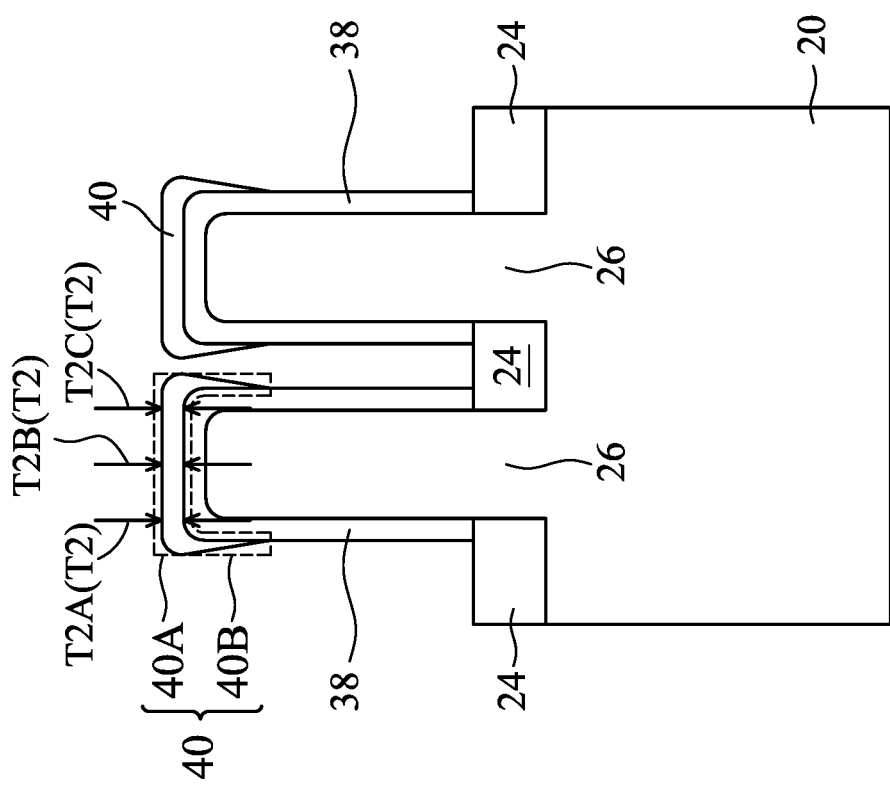

FIGS. 5B, 5C, and 5D illustrate the reference cross-section 5B/5C/5D-5B/5C/5D as shown in FIG. 5A, wherein the bottoms of non-conformal capping layer 40 are at different levels in FIGS. 5B, 5C, and 5D. As shown in FIGS. 5B, 5C, and 5D, non-conformal capping layer 40 has a top portion 40A directly over protruding fins 36, and the thickness of the top portion is denoted as T2. Top portion 40A has a uniform thickness. For example, thicknesses T2A, T2B, and T2C may be the same, with variation smaller than about 5 percent or less. Non-conformal capping layer 40 may or may not include sidewall portions 40B on the sidewalls of protruding fins 36, which sidewall portions, if exist, contact the sidewall portions of dielectric layer 38. For example, FIG. 5B shows that the sidewall portions 40B extend to the bottom of protruding fins 36. FIG. 5C illustrate that the bottom ends of non-conformal capping layer 40 are at around the same level as the top surfaces of protruding fins 36, which means the sidewall portions of non-conformal capping layer 40 substantially do not exist. FIG. 5D illustrates that the bottom ends of non-conformal capping layer 40 extend lower than the top surfaces of protruding fins 36. The bottom ends of the portions 40B may be at any level between the top surfaces and the bottom surfaces of protruding fins 36. For example, the bottom ends of the portions 40B may be between the top surfaces and the mid-height of protruding fins 36.

The thickness of the sidewall portions of non-conformal capping layer 40 is denoted as T3 in FIG. 5B. In accordance with some embodiments of the present disclosure, thickness T3 is measured at the middle height of protruding fin 36, which middle height is between the top surface and the bottom of protruding fins 36. In accordance with some embodiments of the present disclosure, the thickness T2 is in the range between about 5 Å and about 10 Å. The thickness T3 is in the range between 0 Å and about 2 Å, wherein the thickness of 0 Å means that non-conformal capping layer 40 does not extend to the middle height. It is appreciated that when thickness T3 (at middle height of fin 36) is 0 Å, non-conformal capping layer 40 may still extend to the sidewalls of the top portions of protruding fins 36 (as shown in FIG. 5D), for example, to the top 25 percent of protruding fins 36. The thicknesses of the sidewall portions 40B of non-conformal capping layer 40, however, gradually (and may continuously) reduces from top going down, and eventually reduces to 0 Å.

The average thickness of the sidewall portions 40B of non-conformal capping layer 40 may be expressed as $T_{Side\text{-}Avg}$, and the average thickness of the top portions of non-conformal capping layer 40 may be expressed as $T_{Top\text{-}Avg}$. Throughout the description, the average thickness may be determined by choosing a plurality of (such as 5 or more) equally spaced positions, measuring the thicknesses at these positions, and then calculating an average of these thicknesses. For example, FIGS. 5B, 5C, and 5D illustrate three equally spaced positions as an example, which may be candidate positions for determining $T_{Top\text{-}Avg}$. In accordance with some embodiments of the present disclosure, the ratio $T_{Side\text{-}Avg}/T_{Top\text{-}Avg}$ may be smaller than about 0.2, and may be in the range between about 0.05 and about 0.2. As a comparison, for the conformal dielectric layer 38, if the bottom portion of the sidewall portions of dielectric layer is denoted as T1-B, and the top portion of the sidewall portions of dielectric layer is denoted as T1-T, the ratio T1-B/T1-T may be in the range between about 0.9 and about 1.0 in accordance with some embodiments of the present disclosure.

Figure 17:
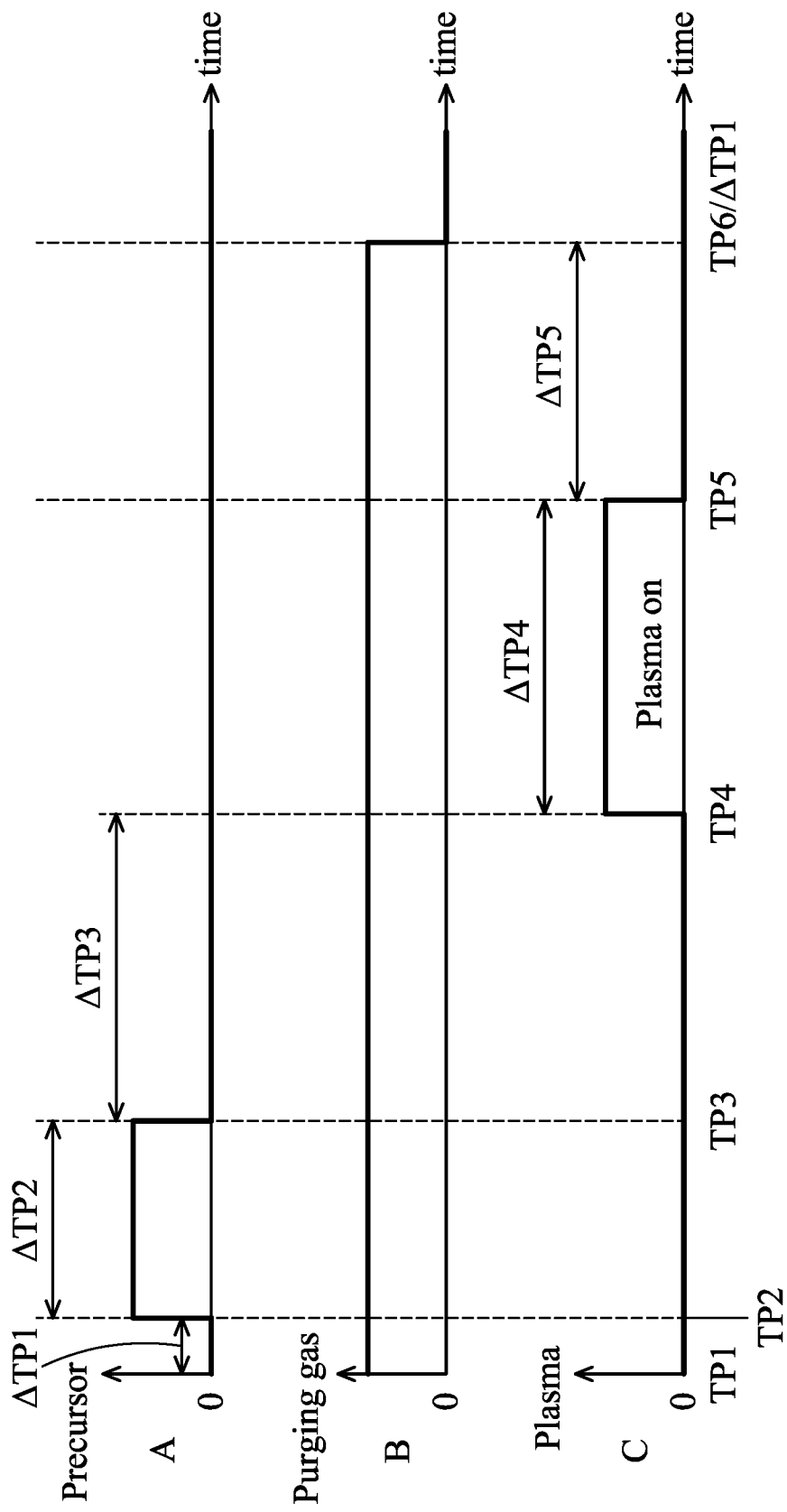
FIG. 17 illustrates the plots of an Atomic Layer Deposition (ALD) cycle for forming a non-conformal capping layer in accordance with some embodiments.

FIG. 17 schematically illustrates a cycle of the non-conformal ALD process for depositing non-conformal capping layer 40 in accordance with some embodiments. FIG. 17 includes three plots A, B, and C, which include the plot of precursor as a function of time, the plot of purging gas as a function of time, and the plot of plasma as a function of time, respectively. The time (horizontal axes) of the plot of precursor, the plot of purging gas, and the plot of plasma are aligned. For plot A, when the corresponding Y-axis value is equal to zero, it represents that the conduction of precursor is stopped. For plot B, when the corresponding Y-axis value is equal to zero, it represents that the conduction of purging gas is stopped. For plot C, when the corresponding Y-axis value is equal to zero, it represents that the generation of plasma is stopped. A sequence of the conduction of precursor, the conduction of purging gas, and the generation of plasma is discussed briefly in an example as below.

Referring to FIG. 17, at time point TP1, the purging gas (plot B) is conducted into a reaction chamber. The reaction chamber is a vacuum chamber that can be vacuumed, and may be used for performing ALD processes. The purging gas has the function of purging the precursor in the corresponding reaction chamber. Furthermore, the purge gas is used to generate plasma, which will provide energy to the precursor that is adsorbed on the wafer 10 shown in FIGS. 4A and 4B. In accordance with some embodiments, the purging gas includes an inert gas, which may include argon, helium, or the like, or combinations thereof. The purging gas may, or may not, include another gas, which may have a high recombination rate (as will be discussed in detail in subsequent paragraphs), and the gas is referred to as high-recombination gas hereinafter. In accordance with some embodiments of the present disclosure, the high-recombination gas included in the purging gas may include hydrogen ($H_2$), nitrogen ($N_2$), or combinations thereof. The addition of nitrogen may also results in the increase in the nitrogen atomic percentage in the resulting non-conformal capping layer 40. The purging gas may be conducted into, and at the same time pumped out of, the reaction chamber continuously throughout the non-conformal deposition process. In accordance with some embodiments of the present disclosure, the total flow rate of the purging gas is in the range between about 50 sccm and about 6 SLM. The pressure in the reaction chamber may be in the range between about 1,000 mTorr and about 8,000 mTorr. The flow rate of the inert gas may be in the range between about 25 sccm and about 6 SLM, and the flow rate of the high-recombination gas may be in the range between about 0 sccm and about 6 SLM, and may be in the range between about 0 sccm and about 25 sccm, or in the range between about 25 sccm and about 6 SLM. During the deposition process, the temperature of the wafer is at a temperature in a range between about 50° C. and about 500° C.

In accordance with some embodiments, the purging gas includes argon or helium, and is free from oxygen ($O_2$). This is different from the conventional PEALD since in the conventional PEALD for forming oxygen-containing dielectrics, oxygen ($O_2$) is used along with argon, and argon breaks the oxygen into oxygen radicals. In the embodiments of the present disclosure, however, the oxygen is not added, and the oxygen in the resulting non-conformal capping layer 40 is fully provided by the precursor. The purging gas may be free from nitrogen ($N_2$), or may include some nitrogen. The adding of nitrogen has two functions. Firstly, the re-combination rate is higher than oxygen. Secondly, by adding nitrogen, the nitrogen atomic percentage in the non-conformal capping layer 40 is increased. In accordance with some embodiments, the flow rate ratio $N_2$/Ar, which is the flow rate of nitrogen to the flow rate of argon, may be smaller than about 0.2. Furthermore, a small flow of hydrogen ($H_2$) may be added to improve the efficiency in the breaking of the bonds in the precursor. For example, the flow rate ratio $H_2$/Ar, which is the flow rate of hydrogen to the flow rate of argon, may be smaller than about 0.2. In the deposition process, a small bias power may be added to improve the non-conformal behavior. For example, the bias power may be in the range between about 0 watts and about 100 watts.

At time point TP2, the precursor starts to be conducted, as shown by the plot A in FIG. 17. In accordance with some embodiments of the present disclosure, the precursor includes a silicon-containing precursor, which may also be an amine-containing precursor and/or a CH-ligand-comprising precursor. For example, the precursor may include bis-di-ethyl-amino-silane (BDEAS), di-iso-propyl-amino-silane (DIPAS), or the like, or combinations thereof. The flow rate of the precursor may be in the range between about 500 sccm and about 6 SLM. The period of time ΔTP2 for conducting the precursor may be longer than about 0.1 seconds, and may be in the range between about 0.1 seconds and about 10 seconds. During the conduction of the precursor, the precursor is adsorbed on the surface of wafer 10 shown in FIGS. 4A and 4B to form a mono layer, and the excess precursor are pumped out of the reaction chamber. The mono layer covers all exposed surfaces of wafer 10 including protruding fins 36 in accordance with some embodiments. It is appreciated that if other gases such as $N_2$, Ar, $H_2$ are used along with the precursor, the required energy for breaking these gases and for these gases to be attached to the surface of wafer 10 is high, and hence these gases will not be adsorbed on the surface of the wafer 10. At time point TP3, the conduction of the precursor is stopped, as shown by plot A, while the purging gas is continuously conducted. With the continuous conduction and the purging of the purging gas, the excess precursor in the gaseous form is removed from the reaction chamber, while the precursor adsorbed on wafer 10 remain. The period of time ΔTP3 is long enough, so that the gaseous precursor is adequately removed. In accordance with some embodiments of the present disclosure, the period of time ΔTP3 is longer than about 1 second, and may be in the range between about 1 second and about 20 seconds or longer. Longer purging time does not affect the result, but causes the throughput to reduce.

After the ending of period of time ΔTP3, and at time point TP4, power is provided to generate plasma from the purging gas, as shown by plot C. The plasma results in the reaction of the adsorbed precursor, whose bonds are broken off from the silicon atoms in the precursor to generate radicals (and ions) such as carbon radical, nitrogen radicals, hydrogen radicals, etc., and the corresponding ions. The silicon atoms remain bonded to the surface of wafer 10. The radicals then bond again with silicon atoms to form a mono-layer of dielectric such as SiC, SiN, SiCN, or the like. The resulting dielectric layer is non-conformal, and the mechanism of the non-conformal dielectric formation is discussed in detail referring to FIG. 16.

The reaction is self-stopping since the amount of the adsorbed precursor molecules is limited, and the reaction will be ended once the adsorbed precursor molecules are fully reacted. Accordingly, the period of time ΔTP4 is selected to be long enough to allow the full reaction of the adsorbed precursor molecules, but short enough so that the throughput is not affected. In accordance with some embodiments, the period of time ΔTP4 may be longer than about 0.05 seconds, and may be in the range between about 0.05 seconds and about 10 seconds. The power for generating plasma may be in the range between about 10 watts and about 500 watts. The plasma may be generated using Inductively Coupled Plasma (ICP) mode, Capacitively Coupled Plasma (CCP) mode, or the like. In accordance with some examples, the frequency of the RF power is 13.56 MHz, while other frequencies may be used.

After the period of time ΔTP4 is ended, the plasma is turned off at time point TP5. In accordance with some embodiments of the present disclosure, a lapse time period ΔTP5 is provided, during which time the purging gas is continuously on, while both of the precursor (plot A) and the plasma (plot C) are turned off. The lapse time period ΔTP5 ends at time point TP6. It is appreciated that time point TP6 is also the time point TP1 of the next ALD cycle, if another cycle of non-conformal ALD process is to be performed. A non-conformal ALD cycle is thus ended. The subsequent non-conformal ALD cycles may be the repetition of the above-discussed non-conformal ALD cycles. The non-conformal ALD cycles may be repeated until the desirable thickness T2 (FIG. 5B) is reached. In accordance with some embodiments of the present disclosure, there may be between 1 cycle and about 1,000 cycles. The total number of cycles depends on the specific application of the embodiment.

In accordance with some embodiments of the present disclosure, the total time period (ΔTP1+ΔTP5) provides the time for purging the un-reacted radicals, ions, etc., in order to prepare for the next non-conformal ALD cycle. In accordance with some embodiments of the present disclosure, the total time period (ΔTP1+ΔTP5) is between about 0.1 seconds and about 100 seconds. In accordance with other embodiments of the present disclosure, the time period ΔTP4 may be long enough, and hence the total time period (ΔTP1+ΔTP5) may be reduced to zero second. This means that if plasma is turned on long enough, for example, longer than about 1 second, the un-reacted radicals, ions, etc. of the precursor will be fully purged when the plasma is on. Accordingly, immediately after the plasma is turned off, the precursor conduction of the next cycle may be started.

To achieve better results without sacrificing throughput, the time periods ΔTP1, ΔTP2, ΔTP3, ΔTP4, and ΔTP5 may be optimized. For example, time period ΔTP2 and time period ΔTP4 may be as small as possible, for example, in the range between about 0.1 seconds and about 10 seconds, and may be close to about 0.1 seconds. Time period ΔTP2 and time period ΔTP4 may be close to or equal to each other, for example, with the absolute value of the difference (ΔTP2−ΔTP4)/ΔTP2 being smaller than about 0.2. On the other hand, time periods ΔTP2 and ΔTP4 are smaller than time periods ΔTP3 and ΔTP5 so that adequate purging is performed through time periods ΔTP3 and ΔTP5.

Figures 18A, 18B:
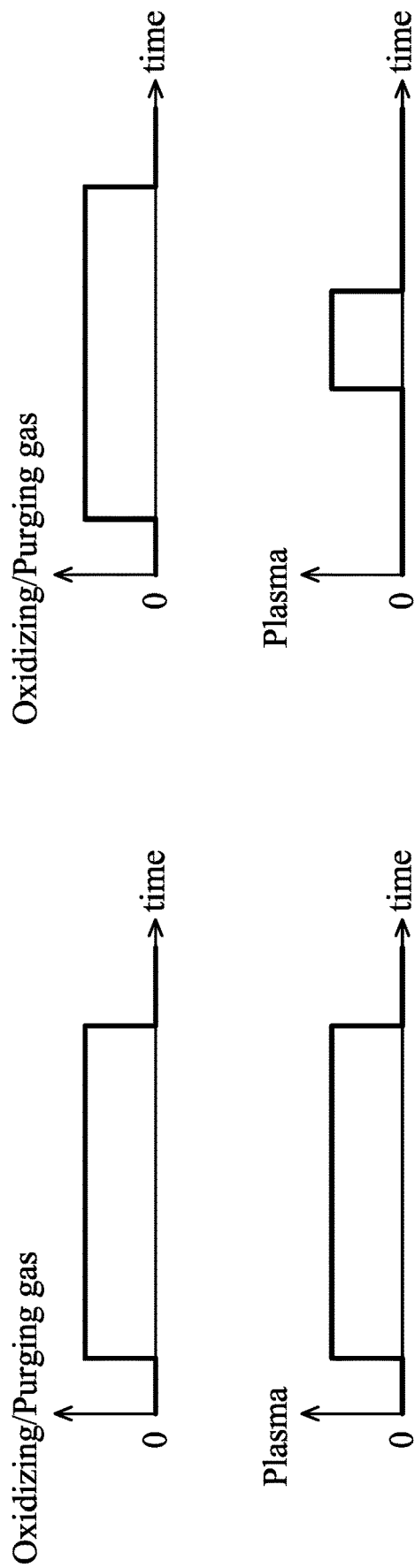
FIGS. 18A and 18B illustrate the plots of oxidation processes for forming a non-conformal capping layer in accordance with some embodiments.

In accordance with some embodiments, an oxidation process is performed after one or a plurality of non-conformal ALD cycles to oxidize the deposited non-conformal capping layer 40 (FIGS. 4A and 4B). Accordingly, depending on the composition of the non-conformal capping layer 40, which may be formed of or comprise SiC, SiN, SiCN, etc., the resulting oxidized non-conformal capping layer 40 may be formed of or comprise SiOC, SiON, SiOCN, etc. In accordance with other embodiments, the oxidation process may be skipped, and the resulting non-conformal capping layer 40 will be formed of or comprise SiC, SiN, SiCN, etc. It is appreciated that dielectric layer 38 and non-conformal capping layer 40 may (or may not) comprise the same elements selected from Si, O, C, N, and the like, while dielectric layer 38 and non-conformal capping layer 40 may have different compositions (with different percentages of the elements) regardless of whether they comprise the same elements or not. FIGS. 18A and 18B illustrate the plots for performing the oxidation process.

In accordance with some embodiments, when the resulting non-conformal capping layer 40 is SiCN, the atomic percentage of carbon may be in the range between about 1 percent and about 50 percent, and the atomic percentage of nitrogen may be in the range between about 1 percent and about 50 percent. When capping layer 40 is SiOCN, the atomic percentage of oxygen may be in the range between about 1 percent and about 50 percent, the atomic percentage of carbon may be in the range between about 1 percent and about 50 percent, and the atomic percentage of nitrogen may be in the range between about 1 percent and about 50 percent.

FIG. 18A illustrates a continuous oxidation process including a single cycle. The top plot in FIG. 18A illustrates the conduction of oxidizing gas and purging gas as a function of time, and the bottom plot illustrates the plasma as a function of time. The time in the top plot corresponds to the time in the bottom plot. In accordance with some embodiments of the present disclosure, the oxidizing and purging gas includes an oxidizing gas, which may include oxygen ($O_2$), ozone ($O_3$), and/or the like. The oxidizing and purging gas may also include a carrier (purging) gas, which may include nitrogen ($N_2$) and/or an inert gas such as argon, helium, or the like. In accordance of alternative embodiments, nitrogen is used, while oxygen is not, and the carrier gas may be added. The corresponding process in FIG. 18 is thus a nitridation process instead of the oxidation process. The flow rate of the oxidizing gas may be in the range between about 1 sccm and about 6,000 sccm, and the flow rate of the carrier gas may be in the range between about 1 sccm and about 6,000 sccm. The period of time for the oxidation may be in the range between about 0.1 seconds and about 100 seconds.

FIG. 18B illustrates an oxidation process in accordance with alternative embodiments. In this process, instead of having the plasma to be turned on all the time when the oxidizing and purging gas is conducted, the plasma is turned on and off in a plurality of cycles. The gas flow of the oxidizing and purging gas may be similar to what is discussed referring to FIG. 18A. In accordance with some embodiments, the on/off ratio may be in the range between about 0.1 and about 0.9. The total number of plasma on/off cycles may be in the range between about 5 and 10.

After the single-cycle or the multi-cycle oxidation process as shown in FIG. 18A or 18B, the process may go back to the non-conformal ALD cycle or cycles as shown in FIG. 17. The processes in FIG. 17 and the process in FIG. 18A (or 18B) may also be collectively form a composite cycle, and the composite cycle may be repeated.

Figure 16:
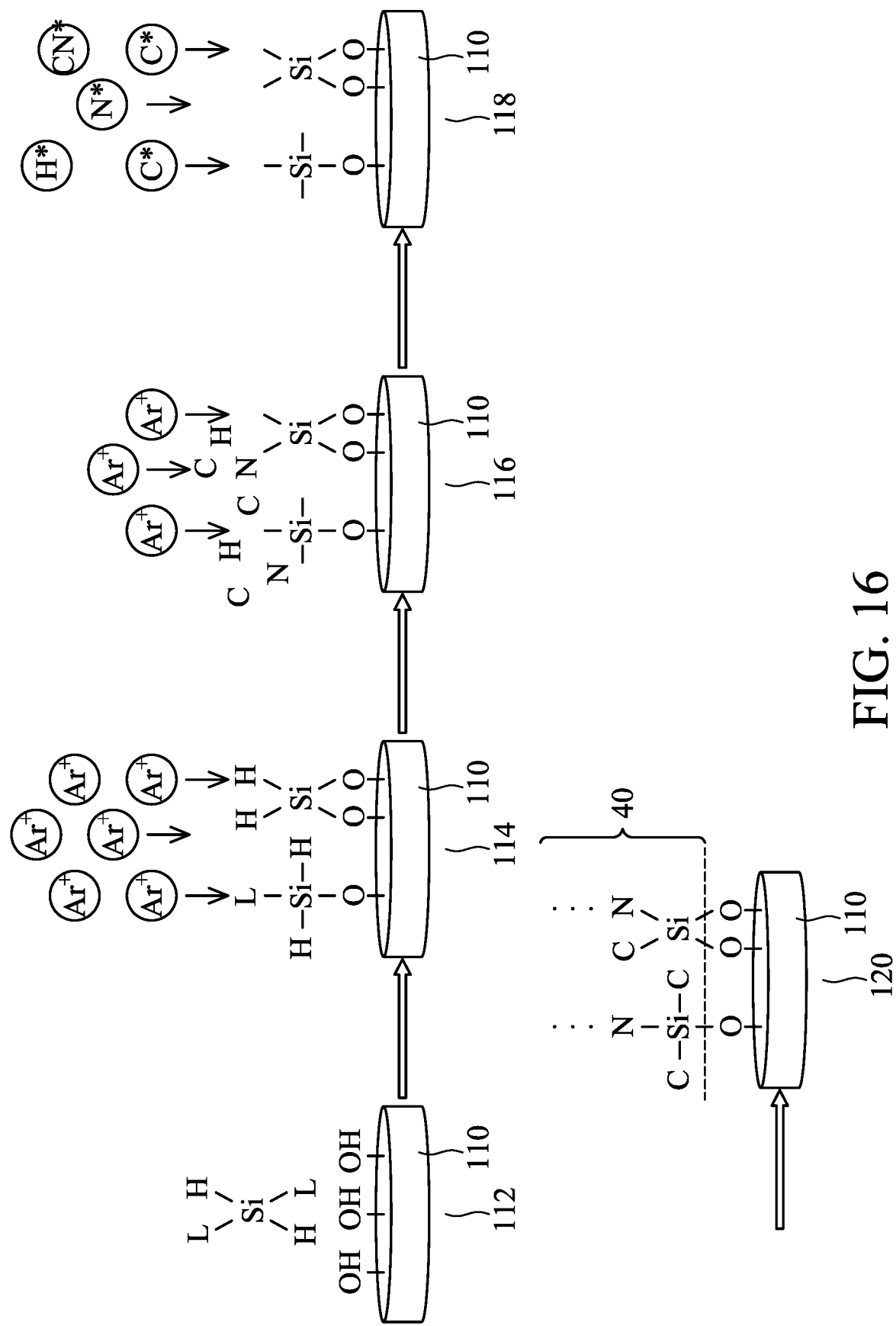
FIG. 16 illustrates example intermediate chemical structures in the formation of a non-conformal capping layer in accordance with some embodiments.

FIG. 16 illustrates an example showing the formation of non-conformal capping layer 40 when the non-conformal ALD cycles are performed on wafer 10. The example is shown by using DIPAS as an example of the precursor. The mechanism as discussed, however, also applies on other types of precursors such as BDEAS. The intermediate structures shown in FIG. 16 are identified using reference numerals 112, 114, 116, 118, and 120 to distinguish the intermediate structures generated by different stages from each other. Wafer 10 includes base layer 110, which may represent the exposed features including dielectric layer 38 and STI regions 24 as shown in FIGS. 4A and 4B, providing the features are exposed in the beginning of the non-conformal ALD deposition process. It is appreciated that the structure shown in FIGS. 4A and 4B is an example, and the embodiments may be applied on other structures.

The initial structure in FIG. 16 is referred to as structure 112. In the illustrated example, base layer 110 is shown as a silicon-containing layer, which may be in the form of crystalline silicon, amorphous silicon, polysilicon, or a silicon-containing compound including, and not limited to, silicon oxide, silicon nitride, silicon oxy-carbide, silicon oxynitride, or the like. In accordance with some embodiments of the present disclosure, OH bonds are formed at the surface of silicon-containing layer 110, wherein the OH bonds may be bonded to the silicon atoms at the surface of base layer 110.

Further referring to structure 112, the precursor is conducted (at time point TP2 as in FIG. 17), which is represented as a silicon atom bonded to two hydrogen atoms and two ligands (functional groups) represented as "L," wherein the ligand L is a functional group having the chemical formula of $N(C_2H_5)_2$ when the precursor includes DIPAS. Some of the precursor molecules are adsorbed on the exposed wafer 10, as shown in the structure 112. The exposed surfaces may be covered with a blanket mono layer of the precursor molecules. The conduction of the precursor is then stopped, and the purging gas continuously to be conducted, so that the excess precursor molecules that are not adsorbed are purged out of the reaction chamber.

Referring to FIG. 16 again, plasma is turned on (at time point TP4 as in FIG. 17), and structure 114 is resulted from structure 112. Assuming argon is used in the purging gas, argon ions are generated, which attack the adsorbed precursor molecules, and break the bonds between OH and the bond between H and Si in the precursor molecules. As a result, the silicon atoms in the precursor molecules are bonded to the oxygen atoms on wafer 10. The silicon atoms may also be bonded to functional groups L or hydrogen atoms, as shown in the resultant structure 114.

With the proceeding of the generation of plasma, the function groups L as in structure 114 are further fragmented to generate carbon radicals and ions, nitrogen radicals and ions, and hydrogen radicals and ions, and the resulting structure is shown as structure 116. These radicals and ions also form plasma, and the generation of the plasma including the further broken ions and radicals is referred to as plasma re-generation. The re-generated plasma includes carbon radicals (C*), nitrogen radicals (N*), hydrogen radicals (H*), and CN radicals (CN*), as shown in structure 118. The radicals and ions generated by the plasma re-generation are then bonded to silicon atoms, and the structure 120 is formed. The resulting dielectric layer 40 comprises SiCN, SiOCN, and the like in the illustrated example.

After the structure 120 is formed, the ALD cycle as shown in FIG. 16 and FIG. 17 is repeated, so that a plurality of mono layers are deposited to form dielectric layer 40, as shown in FIGS. 5A and 5B. In subsequent ALD cycles, the Si—C bonds, Si—N bonds, and Si—O bonds formed in a previous ALD cycle may be broken, and more Si atoms in the precursors introduced in subsequent ALD cycles are bonded, followed by the formation of more Si—C and Si—N bonds. The ALD cycle as shown in FIG. 16 is repeated until the resulting dielectric layer 40 has a desirable thickness.

In accordance with some embodiments of the present disclosure, the process is a non-conformal ALD process, and the mechanism is discussed briefly as follows. Referring back to FIG. 4B, due to the congregation of the plasma at the top of fins, the plasma and the resulting radicals are concentrated close to the tops of protruding fins 36, and are less likely to be present in the trenches between protruding fins 36 since the tops are on the path of the gas flow. The carbon radicals C* and nitrogen radicals N* thus are more likely to be bonded with the open bonds of silicon atoms close to the top of the fins. As a comparison, if the precursor is conducted into the reaction chamber or left in the reaction chamber (other than adsorbed) when the plasma is turned on, a conformal film will be formed. Depending on the precursors and the process conditions, SiC, SiN, or SiCN may be formed as the dielectric layer 40. C* and N* are more active than H* radicals, and hence the resulting dielectric layer 40 does not include hydrogen.

In order for the carbon radicals C* and nitrogen radicals N* to be bonded to silicon atoms, the radicals need to travel (diffuse) to the corresponding positions. The radicals, however, are highly reactive, and their diffusion length is short, and the probability for the C* and N* radicals to travel from the top of fins to the middle and the bottom of fins 36 is low. Furthermore, since the plasma is turned on after the excess precursor molecules have been purged, the source of the C* and N* radicals, which are from the adsorbed precursor, is scarce, and the total number of C* and N* radicals is small. The C* and N* radicals will be reacted locally and conveniently with silicon at the top of fins, and will unlikely to travel to and be bonded to the silicon atoms at the middle and the bottom of the protruding fins. As a result, the deposited dielectric layer 40 is non-conformal, as shown in FIGS. 5A, 5B, 5C, and 5D.

In accordance with some embodiments, as discussed referring to FIG. 17, high-recombination gas such as nitrogen ($N_2$) and/or hydrogen ($H_2$) are provided as a part of the purging gas. These gases will also be broken into radicals by the inert gas plasma. The high-recombination gas has high-recombination rates, which means their radicals N* and H* are very likely to recombine, for example, forming $N_2$ and $H_2$ again. For example, the high-recombination gas has higher recombination rates (and diffuses shorter distances) than oxygen radicals O*. Accordingly, these gases have short diffusion length, and their addition will magnify the non-conformal behavior, and result in the ratio $T_{Side-Avg}/T_{Top-Avg}$ to be even smaller.

To achieve the non-conformal behavior, process conditions are also adjusted. It has been found that higher pressure of the purging gas (which may include $N_2$) and the radicals from the adsorbed precursor results in higher recombination rate since there are more radicals available for recombining, and hence higher pressure results in more non-conformal profile for the deposited dielectric layer 40, and vice versa. On the other hand, if the pressure is too high, the quality of the dielectric layer 40 may degrade because of the too-low energy carried by the radicals. In accordance with some embodiments of the present disclosure, the pressure is controlled to be in the range between about 1,000 mTorr and about 8,000 mTorr.

Furthermore, reducing the plasma power is more beneficial for forming non-conformal capping layer 40 since the radicals are less likely to reach the fin bottom to bond there. On the other hand, if the plasma power is too low (such as lower than 10 watts), the film quality is also degraded. In accordance with some embodiments of the present disclosure, the plasma power is controlled to be in the range between about 10 watts and about 500 Watts.

As a result of the ALD cycle as show in FIG. 16, a mono layer of the dielectric layer 40 is deposited on the top of the protruding structures as shown in FIGS. 5A, 5B, 5C, and 5D, and may not be formed on the sidewalls (especially on the lower portions of the sidewalls) of the protruding structure and on the top of the STI regions 24. Furthermore, the lower parts of the sidewalls have lower probability of having the dielectric layer 40 deposited thereon than the respective upper parts. This causes the thicknesses of the lower portions of sidewall portions 40B of dielectric layer 40 to be increasingly smaller (as shown in FIGS. 5C and 5D), or uniform but thinner than the top portions, as shown in FIG. 5B.

Figure 6A:
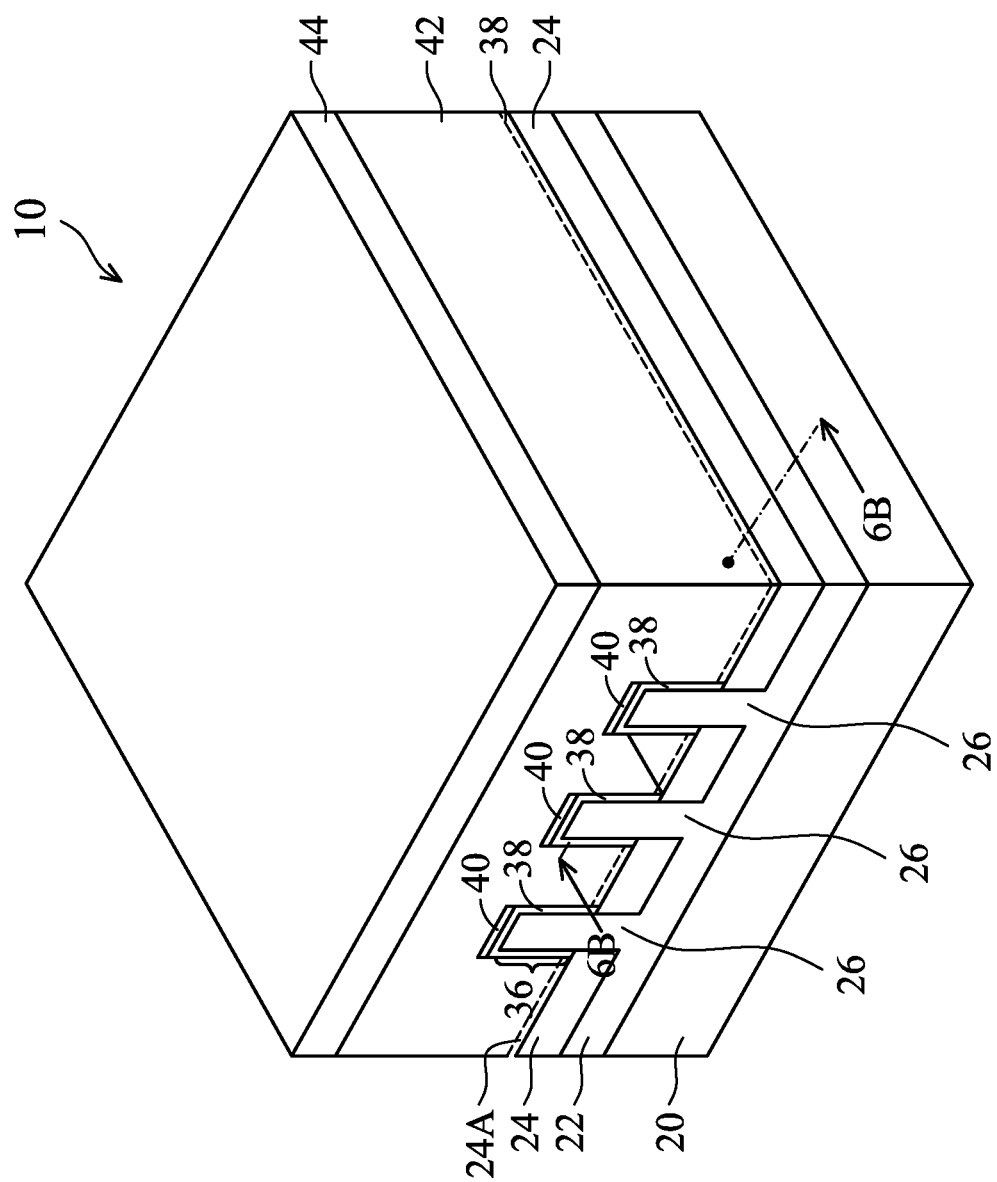
Figure 6B:
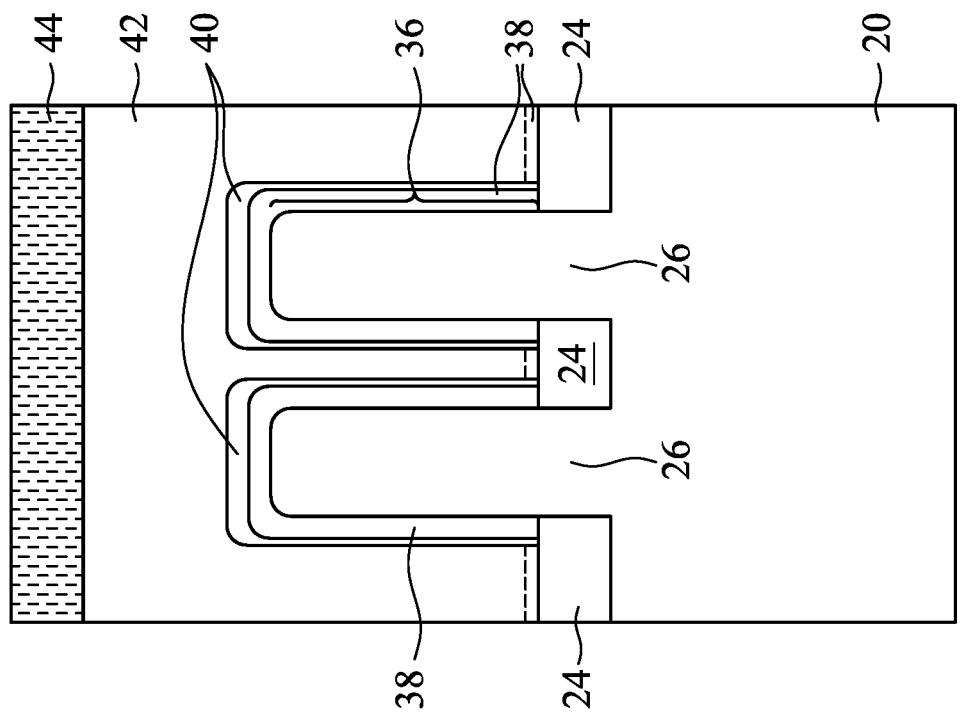

FIGS. 6A and 6B illustrate the deposition of dummy gate electrode layer 42. The respective process is illustrated as process 412 in the process flow 400 as shown in FIG. 19. FIG. 6B illustrates the reference cross-section 6B-6B in FIG. 6A. Dummy gate electrode layer 42 may be formed of or comprise polysilicon or amorphous silicon, and other materials may also be used. The formation process may include a deposition process followed by a planarization process. Hard mask layer 44 is then deposited on dummy gate electrode layer 42. The respective process is illustrated as process 414 in the process flow 400 as shown in FIG. 19. Hard mask layer 44 may be formed of or comprise silicon nitride, silicon oxide, silicon oxy-carbo-nitride, or multi-layers thereof.

Figure 7A:
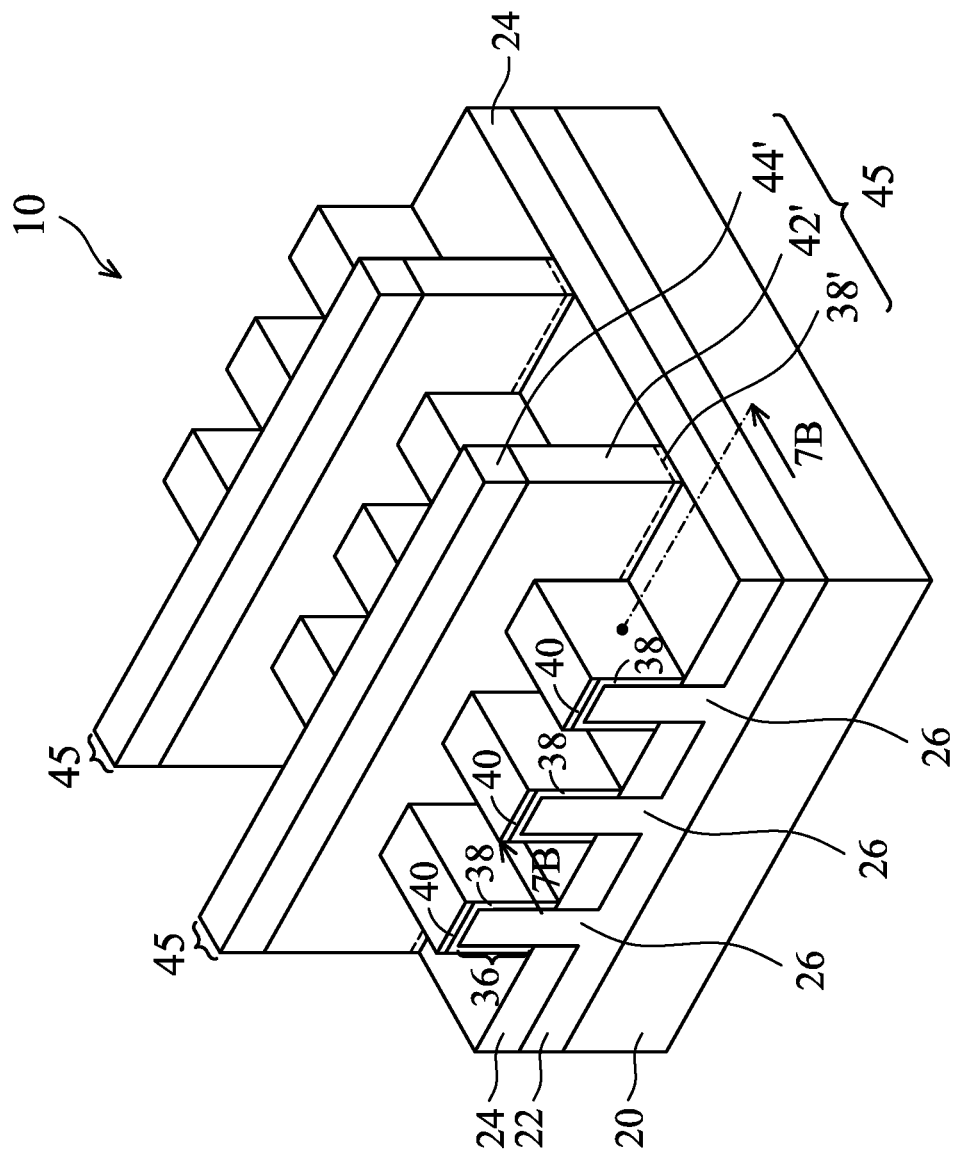
Figure 7B:
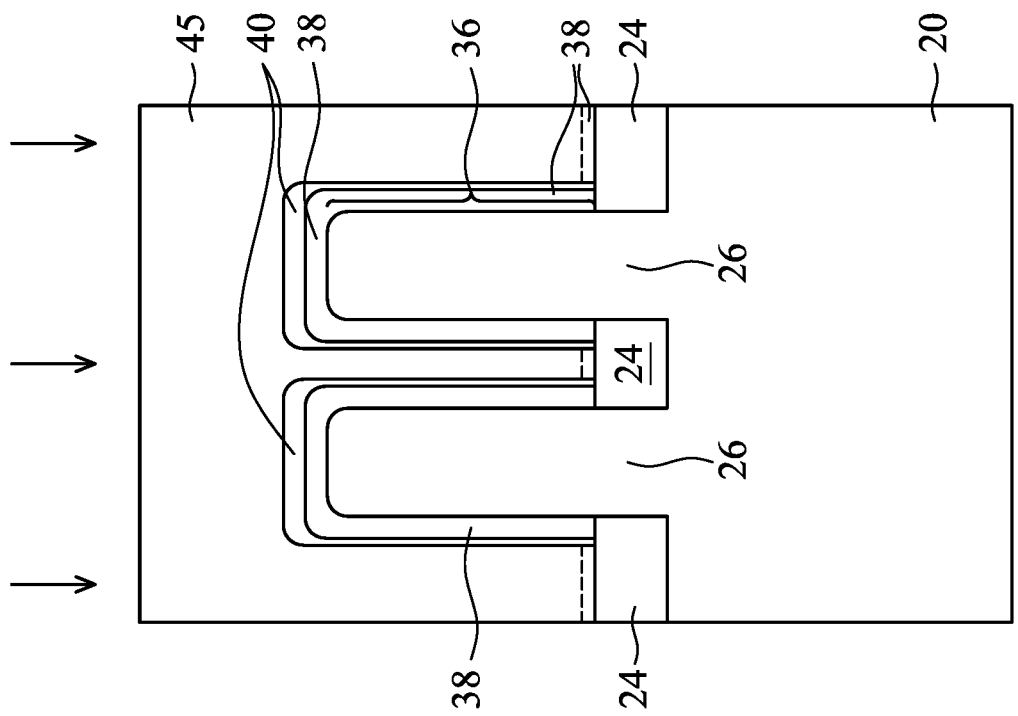

FIGS. 7A and 7B illustrate the patterning process for forming dummy gate stacks 45. The respective process is illustrated as process 416 in the process flow 400 as shown in FIG. 19. FIG. 7B illustrates the reference cross-section 7B-7B in FIG. 7A. In accordance with some embodiments of the present disclosure, hard mask layer 44 is first patterned, for example, using a patterned photo resist as an etching mask. The resulting hard masks are referred to as hard masks 44'. The patterned hard masks 44' are then used as an etching mask to etch the underlying dummy gate electrode layer 42 and dummy gate dielectric 38 to form dummy gate electrodes 42' and dummy gate dielectrics 38', respectively. The etching is performed using an anisotropic etching process.

The etching of dummy gate electrode layer 42, which may be formed of polysilicon, may be performed using a process gas that comprises $C_2F_6$, $CF_4$, $SO_2$, the mixture of HBr, $Cl_2$, and $O_2$, or the mixture of HBr, $Cl_2$, $O_2$, and $CF_2$ etc. In the etching process of dummy gate electrode layer 42, non-conformal capping layer 40 and dummy dielectric layer 38 is used as the etch stop layer. Non-conformal capping layer 40 helps to prevent dummy dielectric layer 38 to be etched-through in the etching of dummy gate electrode layer 42. Otherwise, when non-conformal capping layer 40 is not formed, if dielectric layer 38 is etched-through, since protruding fins 36 may be formed of a same or a similar material (such as silicon) as dummy gate electrode layer 42, the protruding fins 36 will be severely damaged or even completely removed. The non-conformal capping layer 40, which is thicker at top of protruding fins 36, provides enhanced protection to the underlying dielectric layer 38 and protruding fins 36.

In accordance with some embodiments, after the patterning of dummy gate electrode layer 42, the exposed portions of non-conformal capping layer 40 and the underlying portions of dielectric layer 38 are etched, revealing the underlying protruding fins 36. In accordance with alternative embodiments of the present disclosure, non-conformal capping layer 40 is etched, and the underlying portions of dielectric layer 38 are left un-patterned, and will be patterned after the formation of gate spacers. In accordance with yet alternative embodiments of the present disclosure, both of non-conformal capping layer 40 and the underlying portions of dielectric layer 38 are left un-patterned, and will be patterned after the formation of gate spacers.

Figure 8:
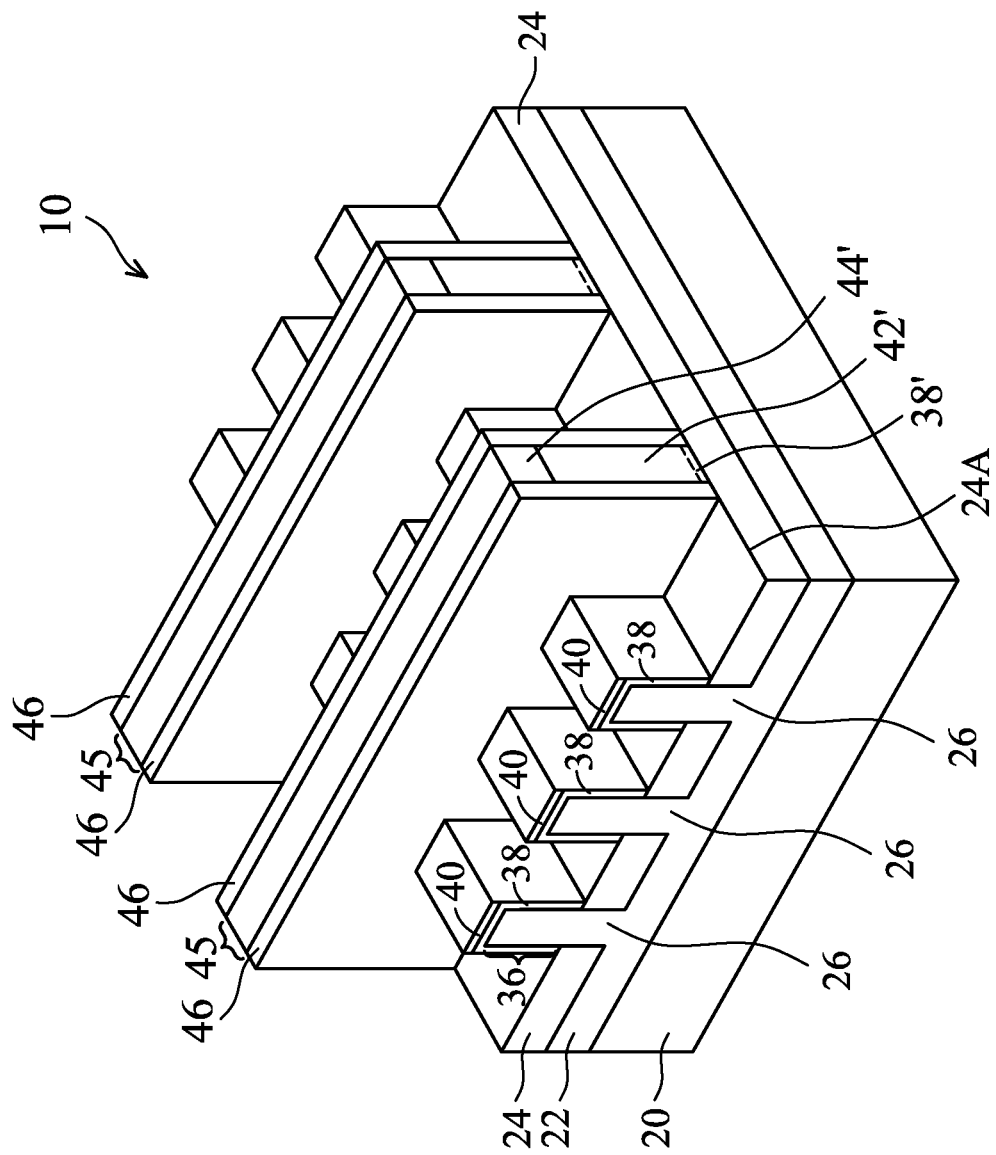
Figure 9:
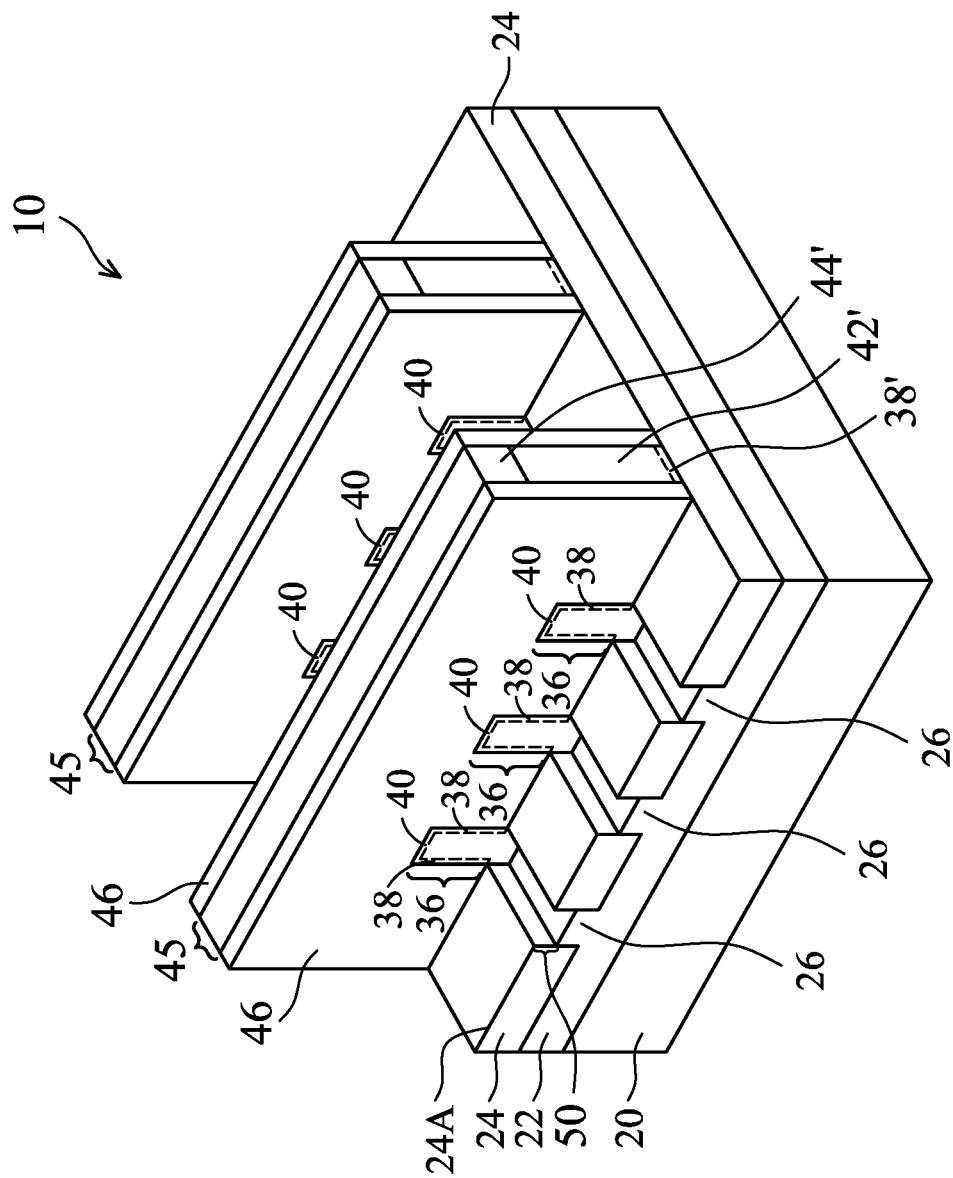

Next, as shown in FIG. 8, gate spacers 46 are formed on the sidewalls of dummy gate stacks 45. The respective process is illustrated as process 418 in the process flow 400 as shown in FIG. 19. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

An etching process is then performed to etch the exposed portions of non-conformal capping layer 40 and the underlying portions of dielectric layer 38 (if not patterned yet). The respective process is illustrated as process 420 in the process flow 400 as shown in FIG. 19. Dashed lines are used to represent the portions of dielectric layer 38 and non-conformal capping layer 40 directly underlying gate spacers 46 that may or may not exist, depending on whether the exposed portions have been etched or not in the preceding processes. The portions of protruding fins 36 that are not covered by dummy gate stacks 45 and gate spacers 46 are etched, resulting in the structure shown in FIG. 9. The recessing may be anisotropic, and hence the portions of fins 36 directly underlying dummy gate stacks 45 and gate spacers 46 are protected, and are not etched.

Figure 10:
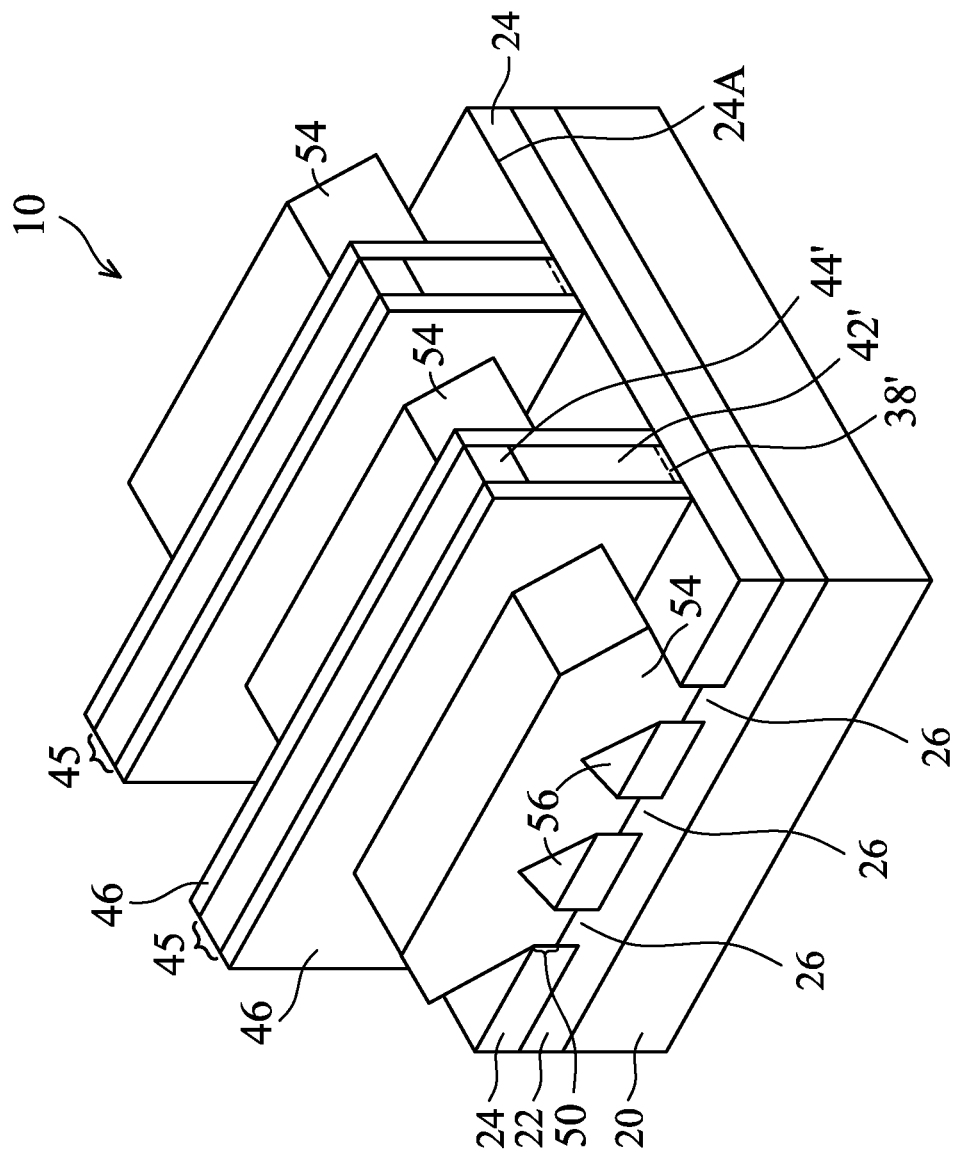

Next, epitaxy regions (source/drain regions) 54 are formed by selectively growing (through epitaxy) a semiconductor material in recesses 50, resulting in the structure in FIG. 10. The respective process is illustrated as process 422 in the process flow 400 as shown in FIG. 19. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 11A:
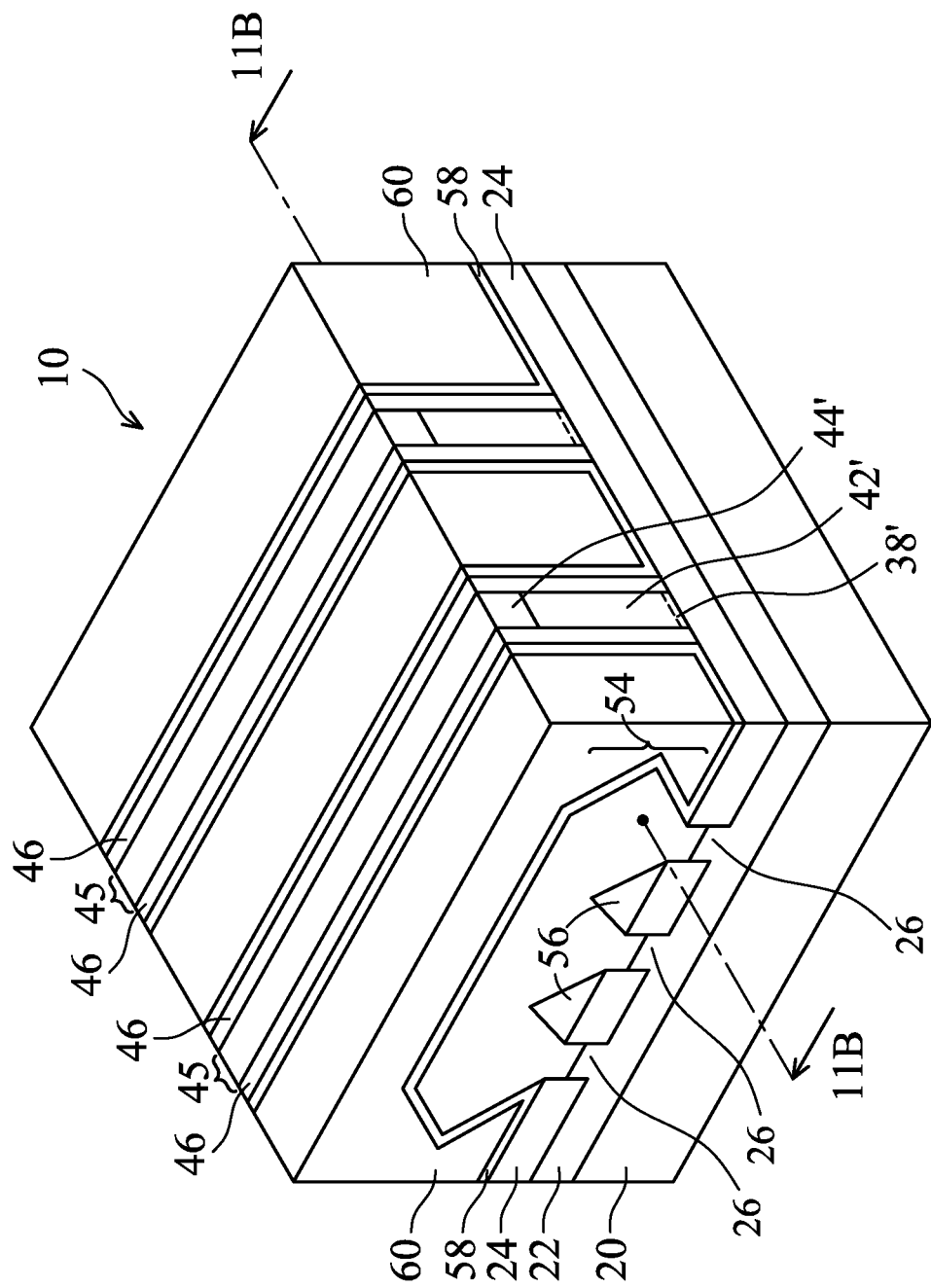
Figure 11B:
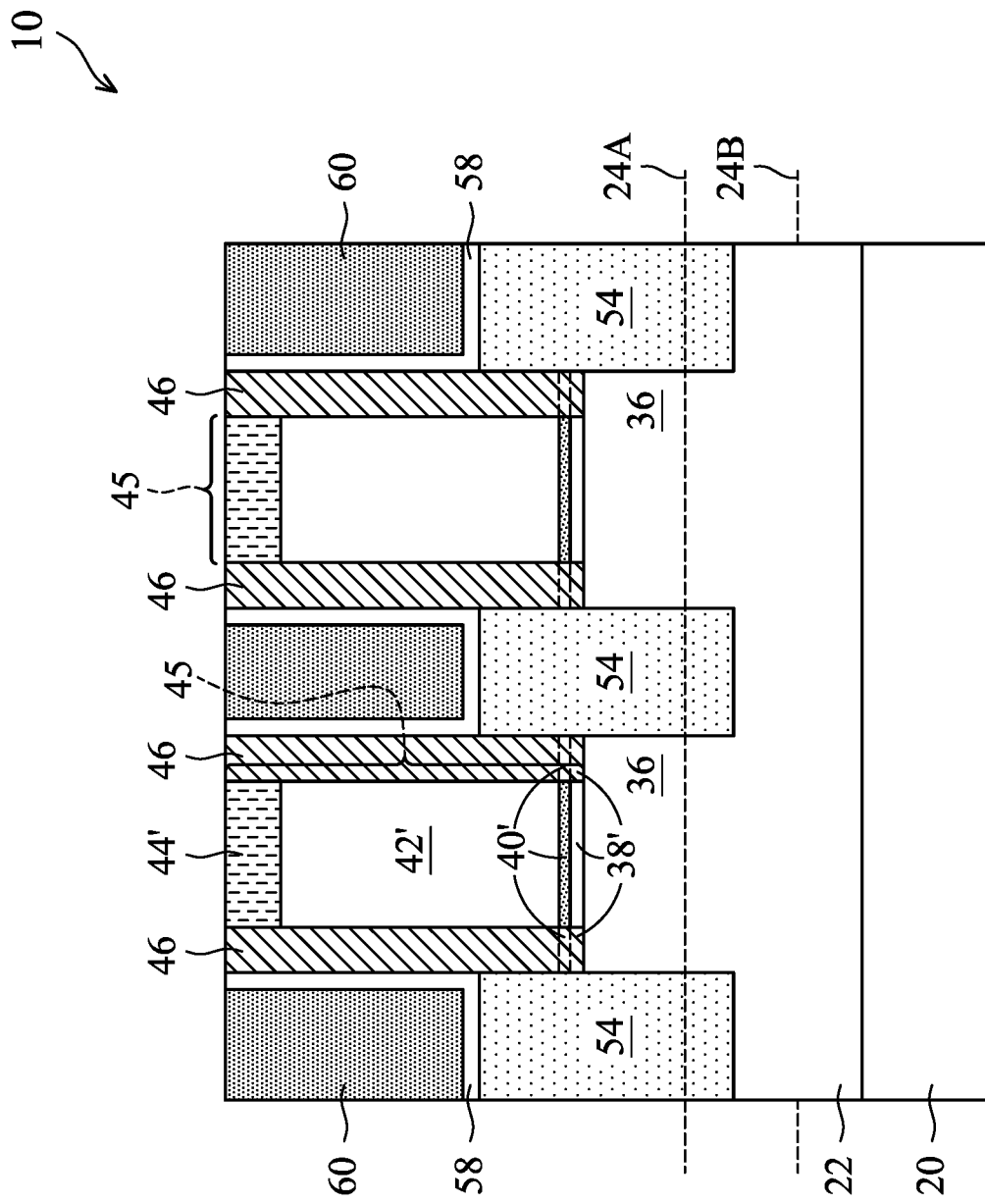

FIG. 11A illustrates a perspective view of the structure after the formation of Contact Etch Stop Layer (CESL) 58 and Inter-Layer Dielectric (ILD) 60. The respective process is illustrated as process 424 in the process flow 400 as shown in FIG. 19. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 45, and gate spacers 46 with each other. FIG. 11B illustrates the reference cross-section 11B-11B as shown in FIG. 11A. Lines 24A and 24B in FIG. 11B represent the top surface and bottom surface, respectively, of STI regions 24.

Figure 12A:
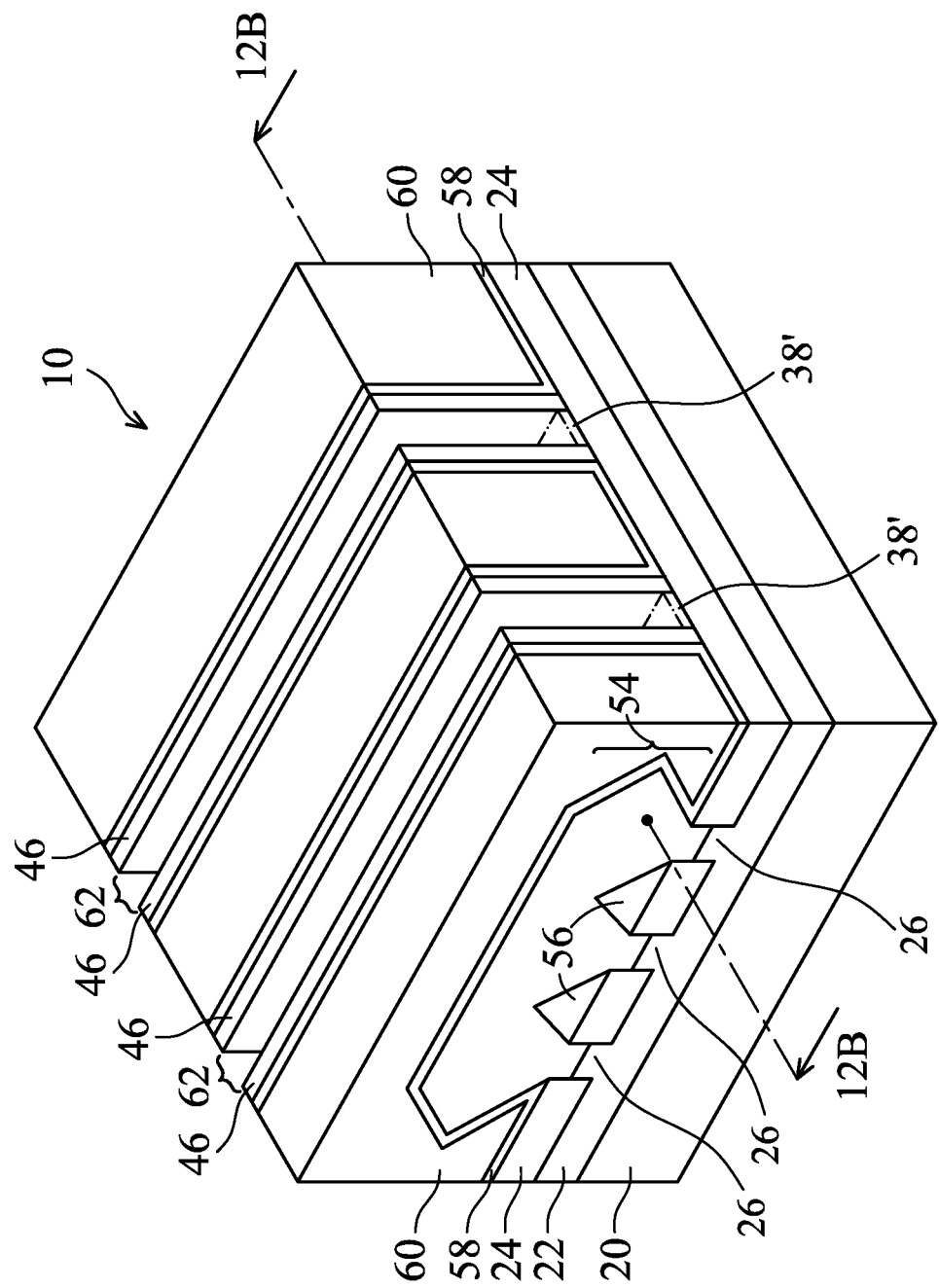
Figure 12B:
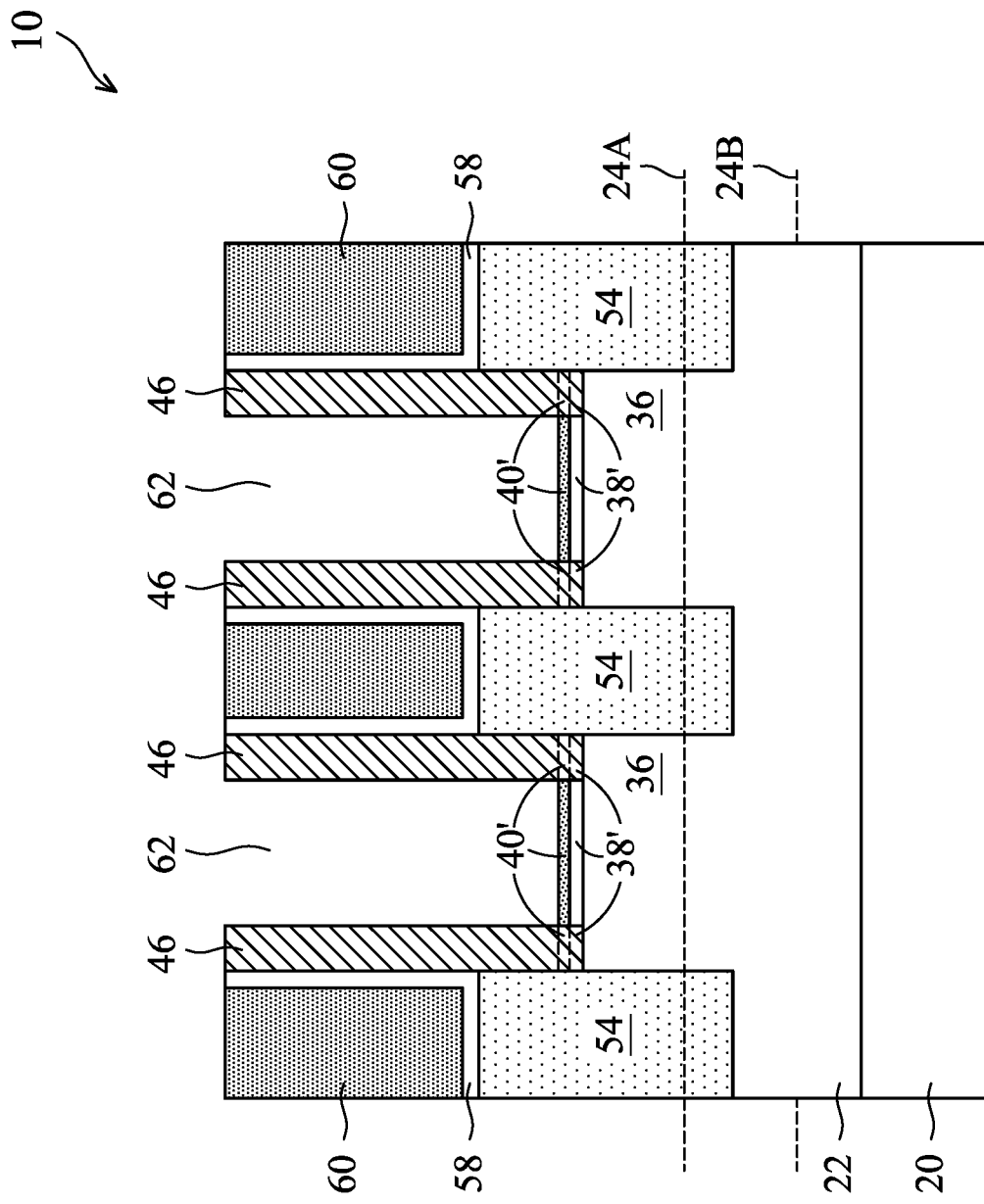
Figure 13:
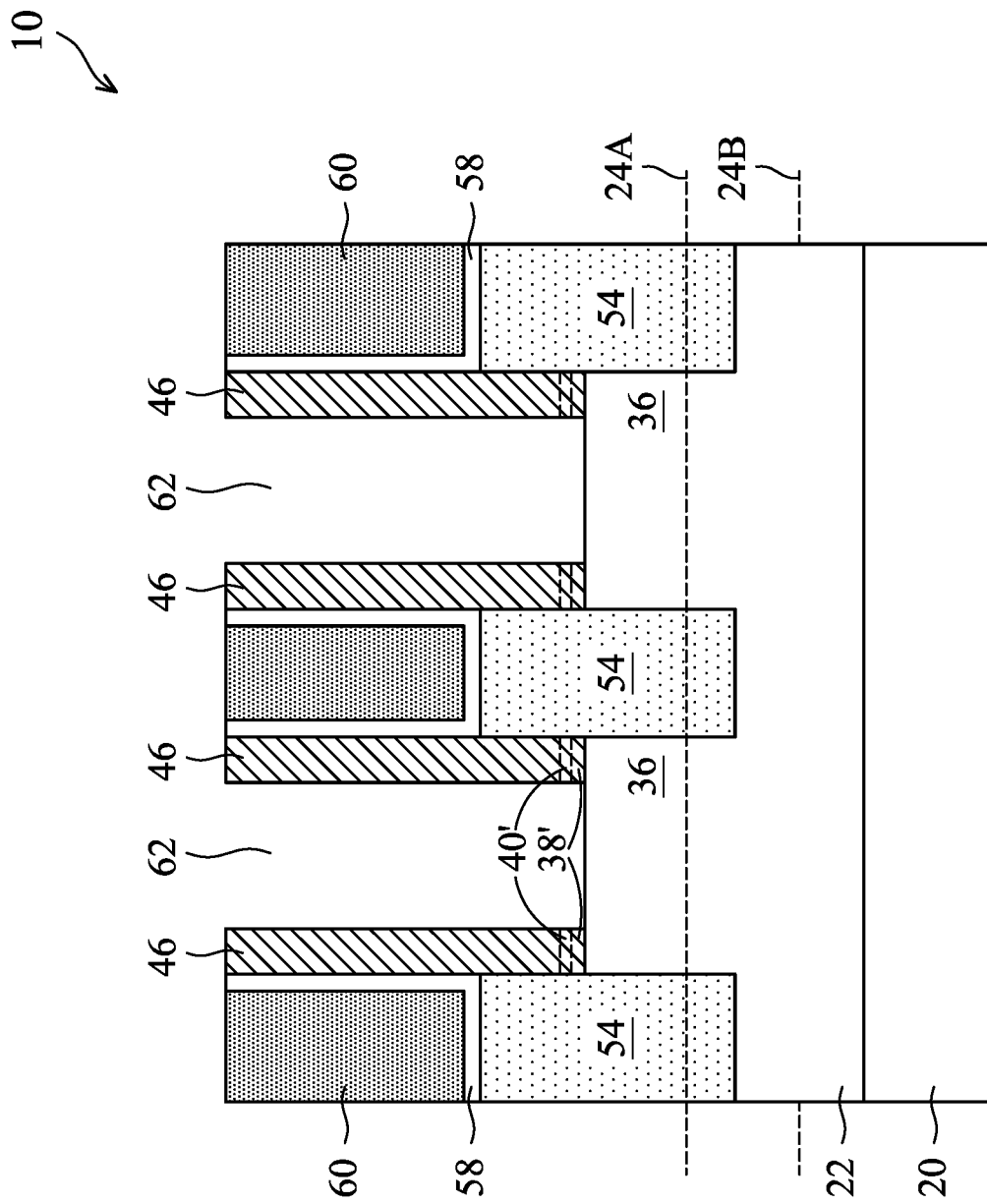

Hard masks 44', dummy gate electrodes 42', non-conformal capping layer 40, and dummy dielectric layers 38' are then removed, forming trenches 62 between gate spacers 46, as shown in FIGS. 12A and 12B. FIG. 12B illustrates the reference cross-section 12B-12B as shown in FIG. 12A. In accordance with some embodiments, the removal of dummy gates electrodes 42' is performed using an anisotropic etching process, similar to the patterning process as shown in FIGS. 7A and 7B. In accordance with alternative embodiments, the removal of dummy gates electrodes 42' is performed using wet etching process. Non-conformal capping layer 40 may protect protruding fins 36 from the undesirable damage during the removal of dummy gates electrodes 42' in case dummy gate dielectrics 38' are damaged. After the removal of dummy gates electrodes 42', non-conformal capping layer 40 is revealed through trenches 62. Non-conformal capping layer 40 and dielectric layer 38' are then removed, and the resulting structure is shown in FIG. 13.

Figure 14A:
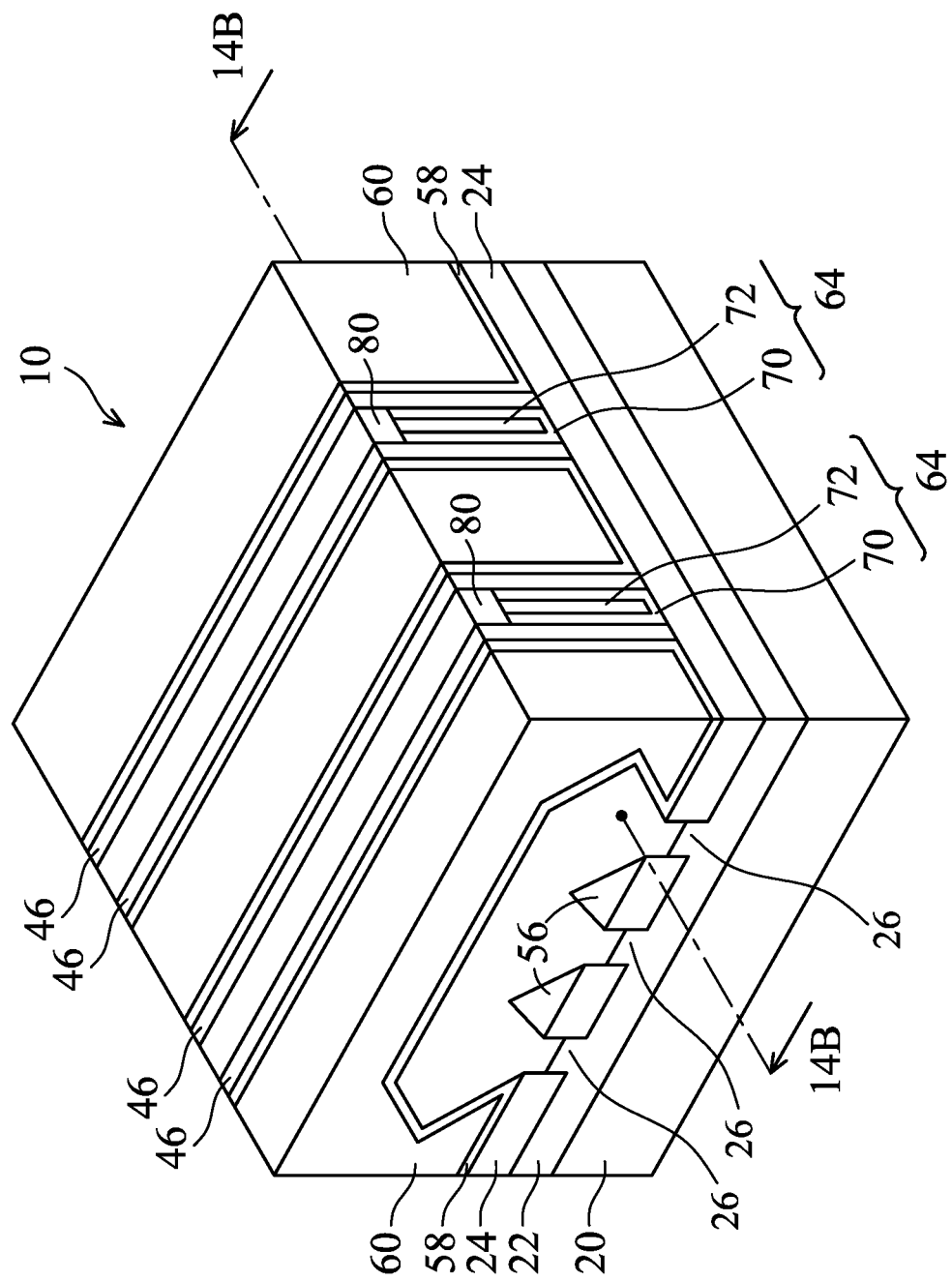
Figure 14B:
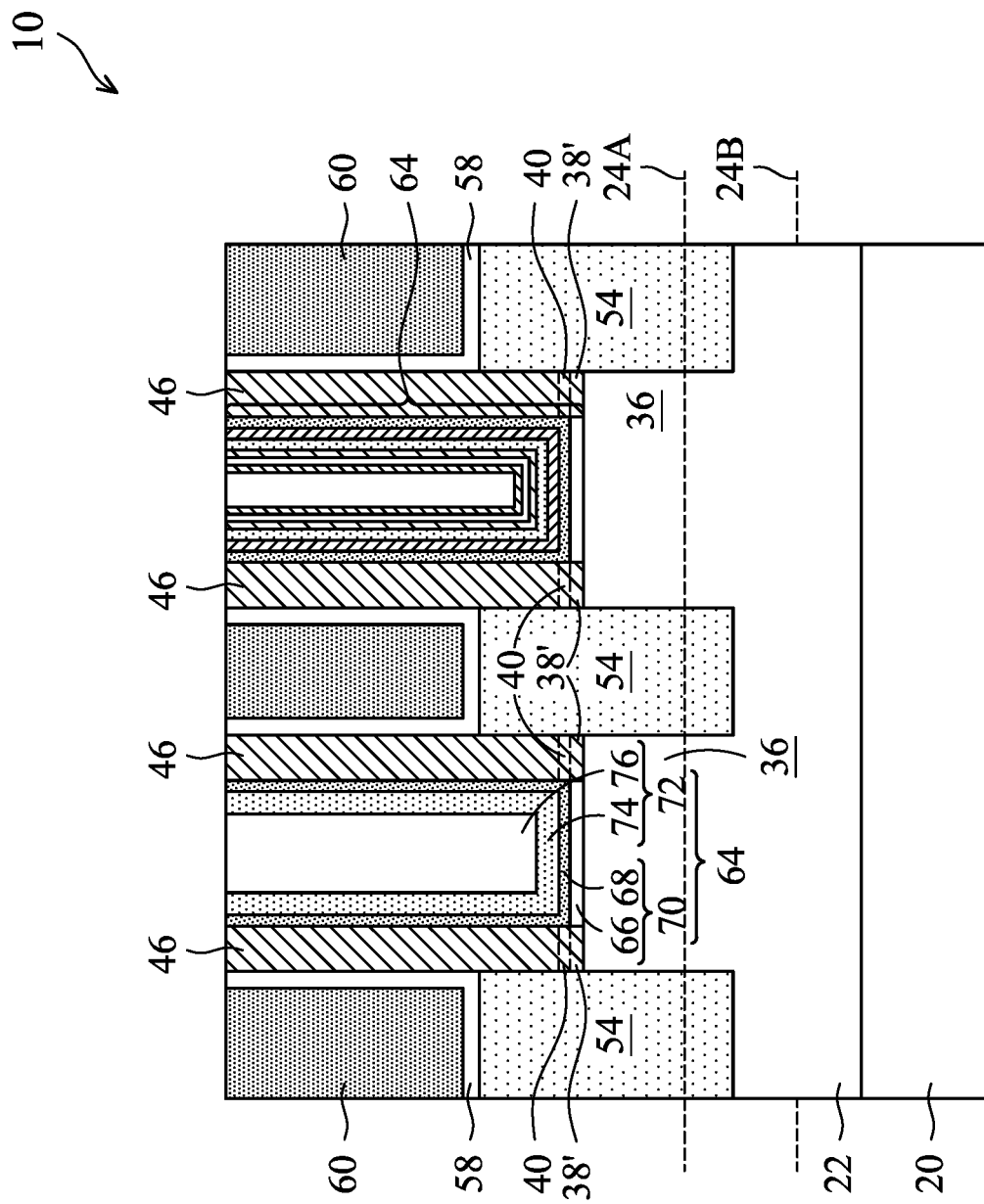

FIGS. 14A and 14B illustrate the formation of replacement gate stacks 64 and self-aligned hard masks 80. FIG. 14B illustrates the reference cross-section 14B-14B as shown in FIG. 14A. As shown in FIGS. 14A and 14B, replacement gate stacks 64 are formed. The respective process is illustrated as process 426 in the process flow 400 as shown in FIG. 19. Gate stack 64 includes gate dielectric 70 and gate electrode 72. Gate dielectric 70 may include Interfacial Layer (IL) 66 and high-k dielectric layer 68 (FIG. 14B). IL 66 is formed on the exposed surfaces of protruding fins 36, and may include an oxide layer such as a silicon oxide layer, which is formed through the thermal oxidation of protruding fins 36, a chemical oxidation process, or a deposition process. High-k dielectric layer 68 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, high-k dielectric layer 68 is formed using ALD, CVD, or the like.

Referring further to FIGS. 14A and 14B, gate electrode 72 is formed on gate dielectric 70. Gate electrode 72 may include stacked layers 74 (FIG. 14B), which may include a diffusion barrier layer (a capping layer), and one or more work-function layer over the diffusion barrier layer. The diffusion barrier layer may be formed of titanium nitride, which may (or may not) be doped with silicon. Titanium nitride, when doped with silicon, is also sometimes referred to as titanium silicon nitride (Ti—Si—N, or TSN). The work-function layer determines the work-function of the gate electrode, and includes at least one layer, or a plurality of layers formed of different materials. The specific material of the work-function layer may be selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the capping layer and the work-function layer, a blocking layer, which may be another TiN layer, may be formed. The blocking layer may be formed using CVD.

Next, metal-filling region 76 is deposited. The formation of metal-filling region 76 may be achieved through CVD, ALD, Physical Vapor Deposition (PVD), or the like, and metal-filling region 76 may be formed of or comprise cobalt, tungsten, alloys thereof, or other metal or metal alloys.

Next, a planarization such as a Chemical Mechanical Polish (CMP) process or a mechanical grinding process is performed, so that the top surface of gate stack 64 is coplanar with the top surface of ILD 60. In a subsequent process, gate stack 64 is etched back, resulting in a recess formed between opposite gate spacers 46. Next, hard mask 80 is formed over replacement gate stack 64. The respective process is illustrated as process 428 in the process flow 400 as shown in FIG. 19. In accordance with some embodiments of the present disclosure, the formation of hard masks 80 includes a deposition process to form a blanket dielectric material, and a planarization process to remove the excess dielectric material over gate spacers 46 and ILD 60. Hard masks 80 may be formed of silicon nitride, for example, or other like dielectric materials.

In the final structure, there may be, or may not be, remaining portions of conformal dielectric layer 38' on protruding fins 36, and non-conformal capping layer 40 on the conformal dielectric layer 38', which remaining portions are directly underlying gate spacers 46, as shown in FIG. 14B. Also, the remaining portions of dielectric layer 38' and non-conformal capping layer 40 directly underlying gate spacers 46 may have same cross-sectional views as shown in FIGS. 5B, 5C, and 5D.

Figure 15:
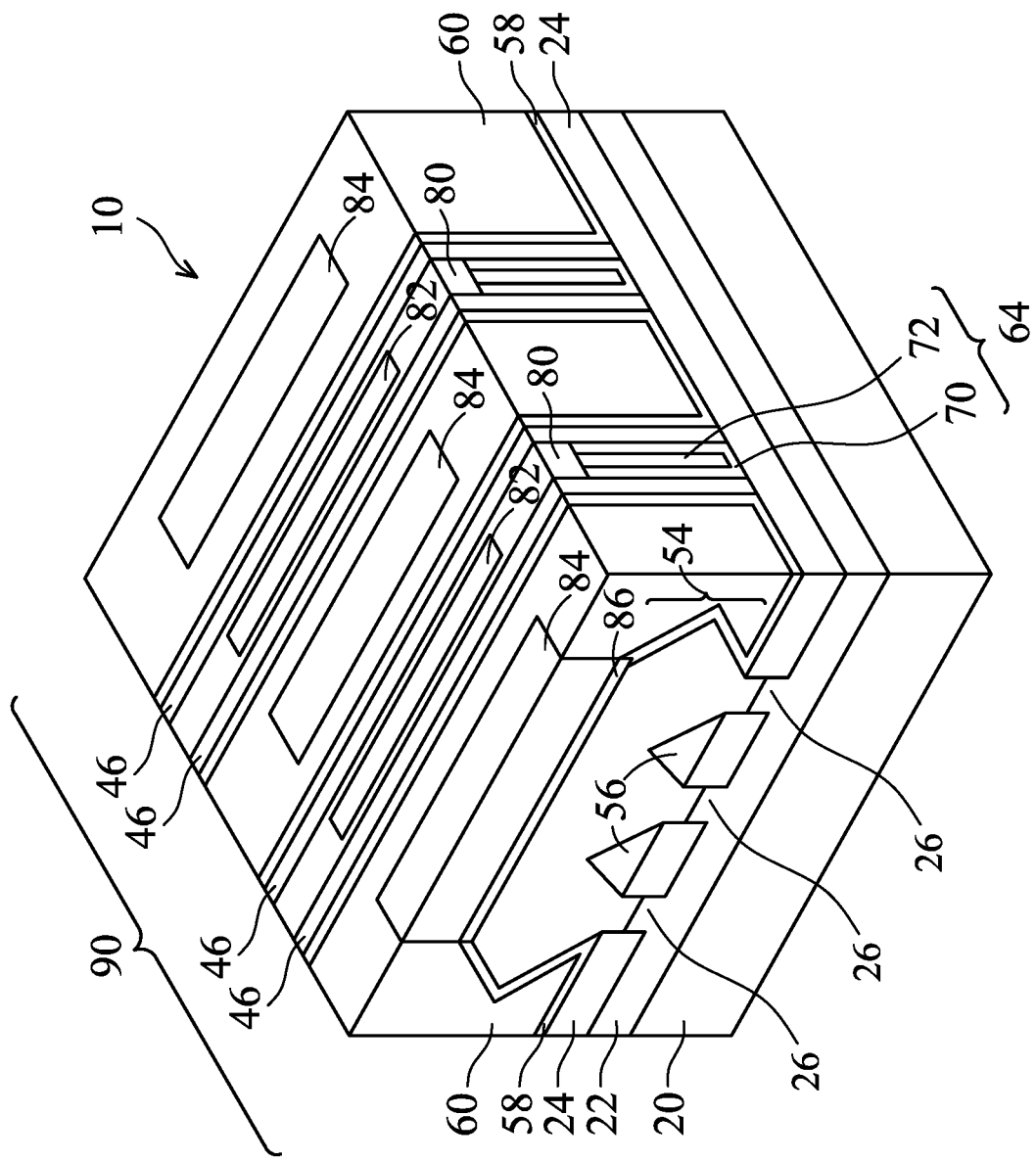

FIG. 15 illustrates some of the features formed in subsequent processes, which may include source/drain contact plugs 84, source/drain silicide regions 86, and the lower portions of gate contact plugs 82. The respective process is illustrated as process 430 in the process flow 400 as shown in FIG. 19. The details of the processes are not discussed herein. FinFET 90 is thus formed.

The embodiments of the present disclosure have some advantageous features. By forming a non-conformal capping layer, the non-conformal capping layer may provide improved protection to the underlying layer/regions when an anisotropic etching is performed. On the other hand, the non-conformal capping layer has very small thicknesses or is not formed on the sidewalls of the underlying protruding features, and thus has little impact on the subsequent processes.

In accordance with some embodiments of the present disclosure, a method comprises forming a protruding structure; and forming a non-conformal film on the protruding structure using an ALD process, wherein the non-conformal film comprises a top portion directly over the protruding structure, wherein the top portion has a first thickness; and a sidewall portion on a sidewall of the protruding structure, wherein the sidewall portion has a second thickness smaller than the first thickness. In an embodiment, the ALD process comprises a plasma-assisted ALD process, with plasma being turned on during the ALD process. In an embodiment, the method further comprises forming a dummy gate electrode layer over the non-conformal film; and patterning the dummy gate electrode layer. In an embodiment, the ALD process comprises a cycle, and the cycle comprises conducting a silicon-containing precursor into a reaction chamber; stopping conducting the silicon-containing precursor; purging the silicon-containing precursor; and after the silicon-containing precursor is purged, turning on plasma. In an embodiment, the purging is performed using a purging gas, and wherein during a period of time the plasma is turned on, the purging gas is continuously conducted into the reaction chamber. In an embodiment, the purging is performed using a purging gas, and wherein during a period of time starting from a first time point the conducting the silicon-containing precursor is ended to a second time point the plasma is turn on, the purging gas is continuously conducted into the reaction chamber. In an embodiment, the forming the protruding structure comprises forming a protruding semiconductor fin; and forming a dielectric layer on the protruding semiconductor fin, wherein the non-conformal film is formed on the dielectric layer. In an embodiment, the non-conformal film has a bottom end higher than a middle height of the protruding semiconductor fin.

In accordance with some embodiments of the present disclosure, an integrated circuit structure includes a semiconductor substrate; isolation regions extending into the semiconductor substrate; a semiconductor fin protruding higher than top surfaces of the isolation regions, wherein the isolation regions are on opposing sides of the semiconductor fin; a dielectric layer on a top surface and sidewalls of the semiconductor fin; and a capping layer comprising a first portion directly over the semiconductor fin, wherein the capping layer comprises a top portion overlying the dielectric layer, wherein the top portion has a first thickness; and a sidewall portion on a sidewall of a top portion of the semiconductor fin, wherein the sidewall portion has a second thickness smaller than the first thickness. In an embodiment, the integrated circuit structure comprises a gate spacer comprising an upper part directly over the top portion of the capping layer, and lower parts on the sidewall portion of the capping layer; and a gate stack contacting the gate spacer. In an embodiment, the sidewall portion of the capping layer has a bottom end higher than a middle height of the semiconductor fin. In an embodiment, lower portions of the sidewall portion of the capping layer are thinner than respective upper portions of the sidewall portion of the capping layer. In an embodiment, thicknesses of the sidewall portion of the capping layer continuously increase from the lower portions to the respective upper portions. In an embodiment, the dielectric layer and the capping layer are formed of different materials. In an embodiment, the dielectric layer and the capping layer comprise same elements selected from the group consisting of Si, O, N, and C, and the dielectric layer and the capping layer have different compositions. In an embodiment, the capping layer is free from horizontal portions directly over the isolation regions.

In accordance with some embodiments of the present disclosure, a structure comprises a protruding structure protruding higher than features on opposing sides of the protruding structure, wherein the protruding structure comprises a top surface and sidewall surfaces; a dielectric capping layer having a top portion directly over the protruding structure, wherein the top portion of the dielectric capping layer has a uniform thickness, and wherein at least bottom portions of the sidewall surfaces of the protruding structure are free from the dielectric capping layer formed thereon; and an additional feature in contact with the top portion of the dielectric capping layer; and lower portions of the sidewall surfaces of the protruding structure. In an embodiment, the protruding structure comprises an inner portion; and a conformal outer portion on the inner portion, wherein a lowest end of the dielectric capping layer is at substantially a same level as the top surface of the inner portion. In an embodiment, the inner portion comprises polysilicon, and the conformal outer portion comprises a dielectric material. In an embodiment, the top portion of the dielectric capping layer has a thickness in a range between about 5 Å and about 10 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a protruding structure;
forming a non-conformal film on the protruding structure, wherein the non-conformal film comprises:
a top portion directly over the protruding structure, wherein the top portion has a first thickness; and
a sidewall portion on a sidewall of the protruding structure, wherein the sidewall portion has a second thickness smaller than the first thickness;
forming a sacrificial region on the non-conformal film; and
removing the sacrificial region, wherein the removing the sacrificial region comprises an etching process, and wherein the non-conformal film acts as an etch stop layer for the etching process.

2. The method of claim 1, wherein the forming the non-conformal film is performed using an Atomic Layer Deposition (ALD) process.

3. The method of claim 2, wherein the ALD process comprises a plasma-assisted ALD process, with plasma being turned on during the plasma-assisted ALD process.

4. The method of claim 1, wherein the forming the non-conformal film comprises:
conducting a silicon-containing precursor into a reaction chamber;
stopping conducting the silicon-containing precursor;
purging the silicon-containing precursor; and
after the silicon-containing precursor is purged, turning on plasma.

5. The method of claim 4, wherein when the plasma is turned on, no precursor that supplies elements in the non-conformal film is supplied.

6. The method of claim 4, wherein the purging is performed using a purging gas, and wherein during a period of time starting from a first time point the conducting the silicon-containing precursor is ended to a second time point the plasma is turn on, the purging gas is continuously conducted into the reaction chamber.

7. The method of claim 1, wherein the forming the protruding structure comprises:
forming a protruding semiconductor fin; and
forming a dielectric layer on the protruding semiconductor fin, wherein the non-conformal film is formed on the dielectric layer.

8. The method of claim 7, wherein the dielectric layer is formed using a conformal deposition process.

9. A method comprising:
forming a protruding semiconductor fin;
depositing a dielectric layer on the protruding semiconductor fin;
depositing a non-conformal film on the dielectric layer, wherein the non-conformal film comprises a top portion overlapping the protruding semiconductor fin, and a sidewall portion on a sidewall of the protruding semiconductor fin, wherein the top portion is thicker than the sidewall portion;
forming a dummy gate electrode on the non-conformal film;
removing the dummy gate electrode to reveal the non-conformal film;
etching the non-conformal film and the dielectric layer to reveal the protruding semiconductor fin; and
forming a replacement gate stack on the protruding semiconductor fin.

10. The method of claim 9, wherein the dielectric layer is deposited using a conformal deposition process.

11. The method of claim 9, wherein the removing the dummy gate electrode is performed using the non-conformal film as an etch stop layer.

12. The method of claim 9, wherein lower portions of the sidewall portion of the non-conformal film are thinner than respective upper portions of the sidewall portion of the non-conformal film.

13. The method of claim 9, wherein the non-conformal film is formed using an atomic layer deposition process, and wherein the sidewall portion of the non-conformal film is deposited at a lower deposition rate than the top portion.

14. The method of claim 13, wherein the forming the non-conformal film further comprises, after the atomic layer deposition process, performing an oxidization process.

15. The method of claim 9 further comprising forming a gate spacer on a sidewall of the dummy gate electrode, wherein after the dummy gate electrode is removed and after the non-conformal film is etched, a portion of the non-conformal film remains underlying the gate spacer.

16. The method of claim 9, wherein the depositing the non-conformal film comprises:
conducting a silicon-containing precursor; and
turning on plasma, wherein the conducting the silicon-containing precursor and the turning on the plasma are performed using an asynchronized mode.

17. A method comprising:
forming a protruding semiconductor fin;
forming a non-conformal film, wherein the non-conformal film extends on a top surface and a sidewall surface of the protruding semiconductor fin, and wherein a sidewall portion of the non-conformal film on a sidewall of the protruding semiconductor fin comprises a lower portion and an upper portion thicker than the lower portion, and wherein the non-conformal film comprises:

a first part; and a second part and a third part on opposite sides of the first part; and removing the first part of the non-conformal film, wherein the second part and the third part remain after the first part of the non-conformal film is removed.

18. The method of claim 17 further comprising:

forming a dummy gate electrode overlapping the first part;

forming gate spacers overlapping the second part and the third part; and before the first part of the non-conformal film is removed, etching the dummy gate electrode using the non-conformal film as an etch stop layer.

19. The method of claim 17, wherein the forming the non-conformal film comprises:

depositing a non-conformal silicon-containing layer; and oxidizing the non-conformal silicon-containing layer.

20. The method of claim 17, wherein the forming the non-conformal film comprises:

depositing a non-conformal silicon-containing layer; and nitriding the non-conformal silicon-containing layer.

\* \* \* \* \*